(12) United States Patent
Naylor et al.

(10) Patent No.: US 12,165,917 B2
(45) Date of Patent: Dec. 10, 2024

(54) INTEGRATED CIRCUIT INTERCONNECT STRUCTURES WITH ULTRA-THIN METAL CHALCOGENIDE BARRIER MATERIALS

(71) Applicant: Intel Corporation, Santa Clara, CA (US)

(72) Inventors: Carl Naylor, Portland, OR (US); Christopher Jezewski, Portland, OR (US)

(73) Assignee: Intel Corporation, Santa Clara, CA (US)

(*) Notice: Subject to any disclaimer, the term of this patent is extended or adjusted under 35 U.S.C. 154(b) by 810 days.

(21) Appl. No.: 17/087,521

(22) Filed: Nov. 2, 2020

(65) Prior Publication Data

US 2022/0139775 A1    May 5, 2022

(51) Int. Cl.
    *H01L 23/522*    (2006.01)
    *H01L 21/768*    (2006.01)
    *H01L 23/532*    (2006.01)

(52) U.S. Cl.
    CPC .. *H01L 21/76843* (2013.01); *H01L 21/76877* (2013.01); *H01L 23/5226* (2013.01); *H01L 23/53238* (2013.01)

(58) Field of Classification Search
    CPC .............. H01L 23/5226; H01L 23/53238
    See application file for complete search history.

(56) References Cited

U.S. PATENT DOCUMENTS

| | | | |
|---|---|---|---|
| 2010/0187693 A1 | 7/2010 | Mountsier et al. | |
| 2017/0033003 A1* | 2/2017 | Song | H01L 29/45 |
| 2020/0194376 A1 | 6/2020 | Naylor et al. | |
| 2020/0312775 A1 | 10/2020 | Lee et al. | |

FOREIGN PATENT DOCUMENTS

EP    3125291    2/2017

OTHER PUBLICATIONS

Extended European Search Report from European Patent Application No. 21197320.1 notified Mar. 1, 2022, 8 pgs.

* cited by examiner

*Primary Examiner* — Samuel A Gebremariam
(74) *Attorney, Agent, or Firm* — Essential Patents Group, LLP

(57) ABSTRACT

Integrated circuit interconnect structures including an interconnect metallization feature with a barrier material comprising a metal and a chalcogen. Introduction of the chalcogen may improve diffusion barrier properties at a given barrier material layer thickness with increasing the barrier layer thickness. A barrier material, such as TaN, may be deposited at minimal thickness, and doped with a chalcogen before or after one or more fill materials are deposited over the barrier material. During thermal processing mobile chalcogen impurities may collect within regions within the barrier material to high enough concentrations for at least a portion of the barrier material to be converted into a metal chalcogenide layer. The metal chalcogenide layer may have greater crystallinity than a remainder of the barrier layer.

19 Claims, 15 Drawing Sheets

INTEGRATED CIRCUIT INTERCONNECT STRUCTURES WITH ULTRA-THIN METAL CHALCOGENIDE BARRIER MATERIALS

BACKGROUND

Demand for higher performance integrated circuits (ICs) in electronic device applications has motivated increasingly dense transistor architectures. Interconnect parasitics become a greater challenge as the density of interconnect structures keeps pace with transistor density. For example, the resistance-capacitance (RC) delay associated with interconnects of an IC increases with the density of the interconnects.

FIG. 1A illustrates a conventional interconnect structure that includes a metal line 101 within a first interconnect level. A transverse width of metal line 101 has some lateral critical dimension CD1. A dielectric material 102 is over metal line 101, and a "via" 103 is subtractively patterned through dielectric material 102 in the z-dimension to expose a portion of metal line 101. Via 103 has a depth DV associated with the thickness of dielectric material 102. A diameter of via 103 has some lateral critical dimension CD2. Often, CD2 is made smaller than CD1 by an amount sufficient to ensure via 103 will land upon metal line 101. The ratio of depth DV to CD2 is referred to as the aspect ratio of via 103. Metal line width CD1 scales down as metal line density increases with increasing transistor density, and so CD2 must also scale down and the aspect ratio of via 103 increases.

As further illustrated in FIG. 1B, via 103 and trench 106 is filled with one or more metals to form a metal line 108 that extends in the x-y dimension to intersect conductive material in via 103 so that two interconnect levels are electrically connected. In this example, a barrier material 105 is on surfaces of trench 106 and via 103. Barrier material 105 may retard diffusion/migration of a fill material 107 out of the interconnect structure, as any loss of fill material 107 is generally catastrophic to an integrated circuit. At some minimum threshold layer thickness barrier material 105 loses the ability to adequately retard diffusion/migration of fill material 107. Depending on the barrier material, this threshold barrier layer thickness may be in the 2-5 nm range, for example.

Barrier material 105 often has significantly higher electrical resistance than fill material 107. As structural dimensions scale, barrier material 105 threatens to become a greater portion of an interconnect structure, leading to higher interconnect resistances. An ultra-thin barrier material thickness would therefore offer IC performance advantages.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION OF EXEMPLARY EMBODIMENTS

Figure 1A:
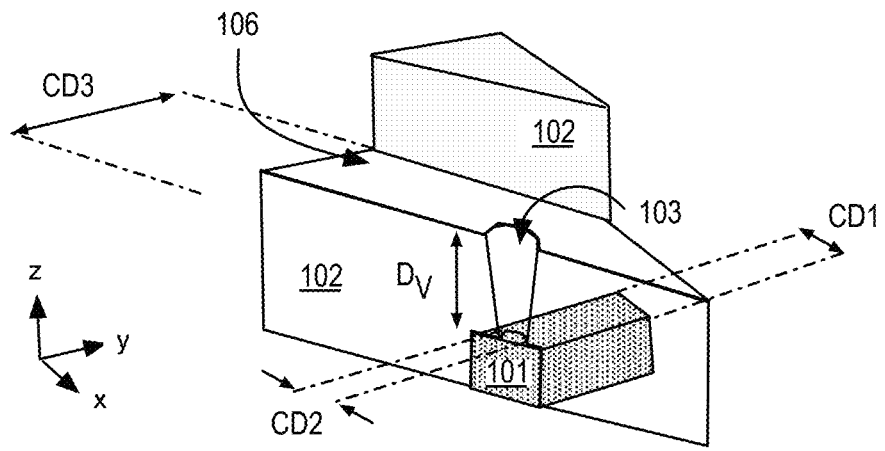
FIGS. 1A and 1B illustrate isometric cross-sectional views of an IC interconnect structure, in accordance with convention.
Figure 1B:
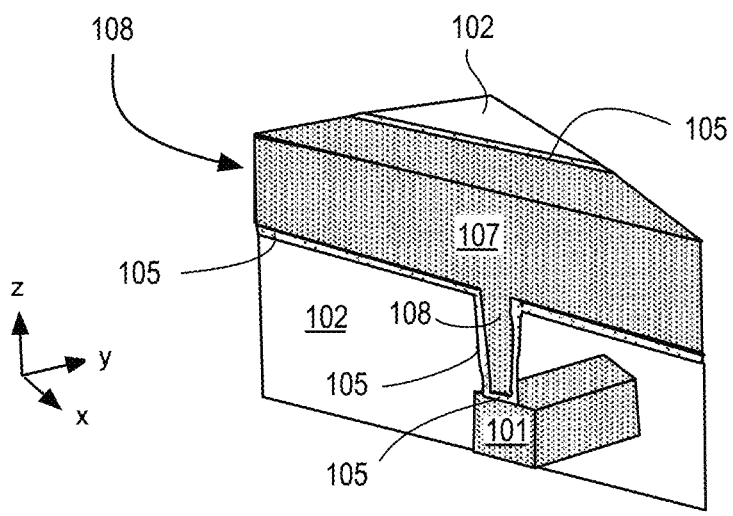

Embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that embodiments may be practiced without these specific details. In some instances, well-known methods and devices are shown in block diagram form, rather than in detail, to avoid obscuring the embodiments. Reference throughout this specification to "an embodiment" or "one embodiment" or "some embodiments" means that a particular feature, structure, function, or characteristic described in connection with the embodiment is included in at least one embodiment. Thus, the appearances of the phrase "in an embodiment" or "in one embodiment" or "some embodiments" in various places throughout this specification are not necessarily referring to the same embodiment. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause and effect relationship).

The terms "over," "under," "between," and "on" as used herein refer to a relative position of one component or material with respect to other components or materials where such physical relationships are noteworthy. For example in the context of materials, one material or layer disposed over or under another may be directly in contact or may have one or more intervening materials or layers. Moreover, one material disposed between two materials or layers may be directly in contact with the two materials/layers or may have one or more intervening materials/layers. In contrast, a first material or layer "on" a second material or layer is in direct contact with that second material/layer. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Described below are examples of integrated circuit interconnect structures that include a barrier material comprising a metal-chalcogen. To form the metal-chalcogen a metallic barrier material may be doped with one or more chalcogens. This chalcogen doping may improve diffusion barrier properties for a given barrier material layer thickness. As described further below, a barrier material, such as TaN, may be deposited to some sub-threshold thickness where it would be inadequate as a diffusion barrier of an interconnect fill material comprising one or more metals. The as-deposited barrier material may be doped with a chalcogen before or after one or more fill materials are deposited over the barrier material. During subsequent thermal processing, the chalcogen dopants within the barrier material and/or the fill material may diffuse toward an interface of the barrier material and the fill material, or another region where there is oxygen present. In regions of the barrier material where the chalcogen dopant concentration increases sufficiently, at least a partial thickness of the barrier material is converted into a metal chalcogenide layer. The formation of the metal chalcogenide layer may consume some portion of the barrier material and not significantly increase the layer thickness of the barrier material. Relative to the as-deposited barrier material, the metal chalcogenide layer may have greater crystallinity and/or enhanced resistance against out diffusion of fill material. Hence, at the sub-threshold thickness, a metal-chalcogen barrier material may function as a robust interconnect barrier layer. Formation of a metal chalcogenide layer may also reduce scattering of charge carriers at the fill-barrier interface.

Figure 2A:
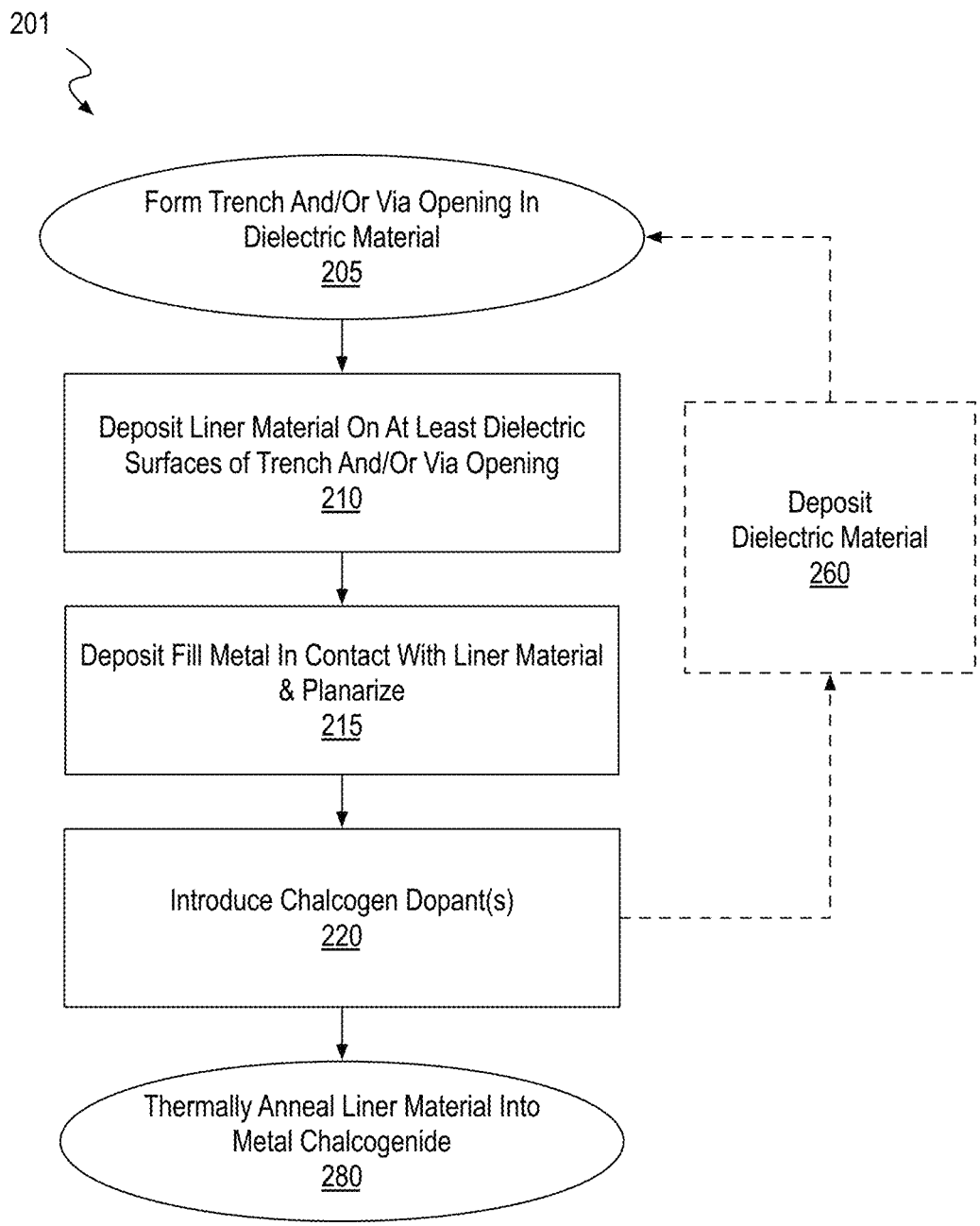
FIG. 2A is a flow chart of methods of fabricating one level of an integrated circuit interconnect structure having an ultra-thin metal-chalcogen barrier material, in accordance with some embodiments.

FIG. 2A is a flow chart of methods 201 for fabricating one level of an integrated circuit interconnect structure including a barrier material comprising a metal-chalcogen, in accordance with some embodiments. Methods 201 may be practiced on a workpiece, such as a large format (e.g., 300-450 mm) semiconductor wafer. The wafer may include a Group IV semiconductor material layer (e.g., Si, Ge, SiGe, GeSn, etc.), a Group III-V semiconductor material layer, or a Group II-VI semiconductor material layer, for example. The workpiece may include one or more underlying device layers including a semiconductor material layer, and may also have one or more interconnect levels interconnecting devices (e.g. transistors) of the devices layers.

Methods 201 begin at operation 205 where at least one of a trench or via opening is subtractively patterned into one or more dielectric materials of an IC interconnect structure. The trench and/or via interconnect structure may be any "dual-damascene" or "single-damascene" type structure patterned into any dielectric material(s) suitable as an IC interlayer dielectric material (ILD). In dual-damascene embodiments, both a trench and a via opening are patterned into the dielectric material at block 205. In single-damascene embodiments, only a via opening is patterned in a first iteration of block 205.

In some exemplary embodiments, the trench or via opening is formed in a low-k dielectric material, for example having a relative permittivity less than about 3.5. The trench or via opening may also be formed in a conventional dielectric material a somewhat higher relative permittivity in the range of 3.5-9. The trench or via opening may also be formed in a high-k dielectric material having an even higher relative permittivity, for example exceeding 9.5. In some specific examples, the trench or via opening is formed in any of SiOC, hydrogen silsesquioxane, methyl silsesquioxane, polyimide, polynorbornene, benzocyclobutene SiN, SiO, SiON, HfO2, ZrO, or Al2O3.

At operation 210 one or more barrier material layers are deposited upon dielectric surfaces of the trench and/or via opening. A barrier material layer may be selectively deposited over dielectric material surfaces at some higher rate than over metallization surfaces, or the barrier material layer may be deposited unselectively upon both dielectric and metallization surfaces at substantially the same rate. Selectivity of the deposition at operation 210 may be at least 3:1, for example, where barrier material is formed upon the dielectric surfaces to a thickness at least three times that of barrier material formed upon a metallization surface. In non-selective embodiments, a barrier material is formed upon the dielectric surfaces to a layer thickness substantially equal to that of barrier material formed upon a metallization surface.

In some exemplary embodiments, operation 210 comprises an ALD process in which deposition precursor molecules are adsorbed to dielectric and/or metal surfaces of the workpiece. In some embodiments, a tantalum precursor, such as, but not limited to, Pentakis(dimethylamido)tantalum, is introduced. Tantalum (Ta), as well as metallic compounds of Ta can function as a good diffusion barrier of many interconnect fill metals, such as Cu. In other embodiments, a molybdenum (Mo) or tungsten (W) precursor is introduced. The ALD process may further comprise co-reactant phase during which adsorbed deposition precursor molecules are chemically reacted to deposit the barrier material. The co-reactant phase may include a plasma, for example to promote chemical reaction at low temperatures. As deposited, the barrier material may be either predominantly a metal or predominantly a metallic compound, such as a metal nitride, metal boride, metal carbide, or the like (e.g., carbon-doped nitride, etc.). In some embodiments where a Ta precursor is reacted with a nitride source, such as ammonia (NH3), TaN is formed.

Any number of ALD cycles including deposition precursor and/or co-reactant phases may be executed at operation 210 to deposit the barrier material to a desired target thickness. Operation 210 may be controlled to form a barrier material of something less than the threshold minimum thickness upon a dielectric surface needed for the barrier material to function as a diffusion barrier for a predetermined fill material. In some embodiments where a barrier material is a sufficiently robust diffusion barrier at a minimum thickness threshold of 2 nm, the thickness of the barrier material deposited at operation 210 is no more than 2 nm, and may be 1-2 nm, or even less than 1 nm. At such reduced thicknesses, the barrier material may be discontinuous over trench and/or via surfaces, for example with pinholes, and may not pose a sufficient barrier against out diffusion of an interconnect fill material into the dielectric material.

At operation 215, one or more fill materials are deposited in contact with the barrier material. Any deposition process known to be suitable for depositing a particular fill material into a trench and/or via opening may be practiced at operation 215 as embodiments are not limited in this respect. In some examples, an electrolytic plating process is practiced at operation 215 to deposit a fill metal. In further embodiments, multiple deposition processes may be practiced at operation 215. For example, an electrolytic plating process may be preceded by physical vapor deposition (PVD) of a seed layer. Deposition of the fill materials may also comprise PVD, chemical vapor deposition (CVD), atomic layer deposition (ALD) or electroless plating. For example, a wetting material layer may be deposited by PVD, CVD, ALD or electroless plating prior to the electrolytic plating of a fill metal comprising predominantly copper.

Operation 215 is completed with a planarization of at least the fill materials and the barrier material to expose a top surface of the dielectric material surrounding the trench or via opening. The planarization process may remove any fill material and barrier material from the dielectric material in regions beyond a perimeter of an interconnect structure. Any planarization (e.g., CMP) process may be practiced to complete metallization of an interconnect feature.

Methods 201 continue at operation 220 where chalcogen dopants are introduced into the interconnect structure. For embodiments herein, chalcogens include sulfur, selenium or tellurium (oxygen is excluded). In some exemplary embodiments, operation 220 comprises exposing the interconnect structure fabricated thus far to a gas/vapor phase chalcogen precursor comprising at least sulfur (which has an advantageously high solid phase mobility in most transition metals).

In some embodiments, at operation 220, the workpiece may be heated to over 100° C. (e.g., 125° C., 150° C., 200° C., or 250° C.) for a predetermined time in the presence a chalcogen precursor gas within a reaction chamber. The chalcogen precursor gas may have various compositions, with some examples including H2S, H2Se, H2Te. As these examples can also act as strong reducing agents, they may be combined or replaced with weaker reducing agents/stronger oxidizing agents. For example, in some embodiments SO2 or SeO2 is introduced in combination with, or to the exclusion of, H2S or H2Se, respectively. Gases lacking oxygen temper the reducing strength somewhat less than those that introduce oxygen. Other gases, such as, NH3, N2, Ar, N2O, or SxOy, SexOy, TexOy with x or y being 1, 2 (e.g., SO2, SeO2) or 3, or SFz, Sez or Tez with z either 4 or 6 (e.g., SF6, TeF6) may also be introduced in combination with one or more of H2S and, H2Se and or H2Te.

For dual-damascene embodiments, methods 201 are substantially complete following operation 220 with one level of interconnect fabricated. Methods 201 may be repeated for each successive interconnect level that is to include a dual-damascene interconnect structure. Alternatively, in single-damascene embodiments where only a via opening is filled at operation 215, methods 201 may continue with operation 260 where a dielectric material is deposited over the interconnect via formed thus far. Any deposition process known to be suitable for forming an ILD may be practiced at operation 260 as embodiments herein are not limited in this respect. Methods 201 may then continue with a second iteration of operation 205 where a trench is formed in the dielectric material deposited at operation 260 to expose a portion of the interconnect via. At block 210, one or more barrier material layer(s) are again deposited selectively. Hence, for single-damascene embodiments, two barrier material deposition operations 210 may be performed. Methods 201 may then continue with a second fill operation 215 where one or more fill materials are deposited at planarized to compete one level of interconnect. A second chalcogen doping at operation 220 may also be performed before backend of line processing is completed at operation 280.

Methods 201 complete at operation 280, where any backend of line processing is performed. For example, one or more additional interconnect levels may be fabricated. In some embodiments where chalcogen dopants have not be fully incorporated into the barrier material (e.g., during formation of the barrier material), one or more thermal processes are performed at operation 280 to diffuse chalcogen dopants through the fill material and/or barrier material toward gettering regions. At operation 280, the workpiece is heated to over 200° C. (e.g., 225° C., 250° C., 300° C., or 350° C.) for a predetermined time in the presence of any suitable ambient, such as, but not limited to nitrogen (N2), or forming gas (N2:H2). Ar elevated temperatures, chalcogen dopants have high mobility through grain boundaries of fill material. Operation 280 may be performed once for each level of interconnect, or may be performed once after all levels of interconnect of an IC have been fabricated (e.g., at the end of an IC fabrication process). In some alternative embodiments, thermal processing may be performed concurrently with chalcogen doping operation 220.

During thermal processing, chalcogen dopants present within the fill material and/or barrier material may diffuse and come to rest in low energy states at material interfaces. The inventors have observed the interface between fill material and barrier material to be one gettering region where chalcogen concentrations can become highest. The inventors have also observed higher chalcogen concentrations within regions of the barrier material where oxygen is also present, for example as a result of the formation of a native oxide on the barrier material. Within regions of the barrier material where chalcogen concentrations are sufficient, thermal processing may further convert at least a partial thickness of the barrier material into a metal chalcogenide layer. The metal chalcogenide may be a dichalcogenide (MX2), but need not be a dichalcogenide because a number of oxidation states are possible. As such, the resulting compound is better characterized as MaXbYc, where M is a metal having some atomic ratio with chalcogenides X and/or Y. The metal M may be any of Sc, Ti, V, Cr, Mn, Fe, Co Ni, Cu, Zn, Y, Zr, Nb, Mo, Tc, Ru, Rh, Pd, Ag, Cd, Ln, Hf, Ta, W, Re, Os, Ir, Pt, Au, for example.

Figure 2B:
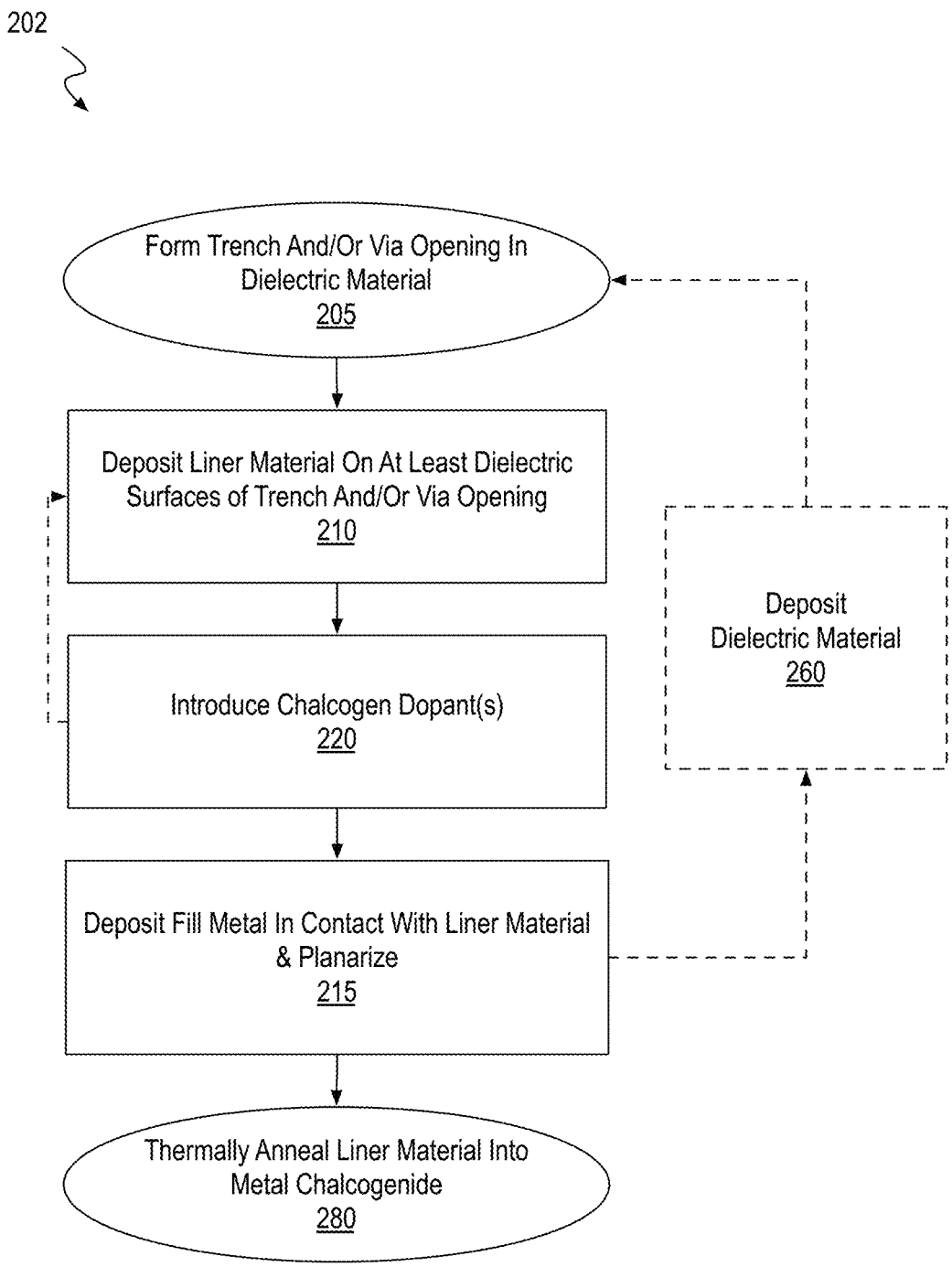
FIG. 2B is a flow chart of methods of fabricating one level of an integrated circuit interconnect structure having an ultra-thin metal-chalcogen barrier material, in accordance with some alternative embodiments.

FIG. 2B is a flow chart of methods 202 for fabricating one level of an integrated circuit interconnect structure having metal-chalcogen barrier material, in accordance with some alternative embodiments where the barrier material is doped with a chalogen prior to deposition of a fill material. In methods 202, reference numbers are retained for operations that are substantially the same as those of methods 201 (FIG. 2A).

As shown in FIG. 2B, methods 202 again begin at operation 205 with the receipt of a workpiece having some portion of lower-level metallization exposed within a patterned dielectric material. At operation 210, barrier material is deposited (either selectively, or not) upon at least dielectric material surfaces of a trench pattern and/or via opening. A chalcogen is introduced into barrier material (e.g., by exposing the barrier material to a chalcogen precursor) at operation 220. Following deposition and doping of the barrier material, fill material is then deposited upon the barrier material at operation 215.

In some embodiments, chalcogen doping is performed concurrently with barrier material deposition (i.e., operations 210 and 220 are performed concurrently). For embodiments where barrier material is deposited by ALD, to incorporate a chalcogen one or more phases of the ALD cycle may be performed in the presence of a chalcogen precursor, such as but not limited to, the gases described above (e.g., H2S). An ALD cycle may include a discrete co-reactant phase where the workpiece is exposed to the chalcogen precursor with or without the generation of a plasma. For an exemplary embodiment where a Ta precursor is introduced during a first ALD phase, execution of a second ALD phase may include a chalcogen source (e.g., H2S) to convert the Ta precursor into TaSx. For TaN barrier embodiments, the Ta precursor phase may be combined with a co-reactant phases that alternates at some cycle duty rate between a nitrogen source (e.g. NH3) and a chalcogen source (e.g., H2S) to alternately from TaN and TaSx. In other embodiments where barrier material is deposited by PVD, a reactive sputter process having a predetermined partial pressure of H2S may be practiced to incorporate dopants directly into the deposited barrier material.

In alternative embodiments, operation 220 is performed after a full thickness of the barrier material has been deposited. For such embodiments, chalcogens may be introduced into the barrier layer in the same manner they may be introduced into the fill material. For example, the barrier material may be heated to over 100° C. for a predetermined time in the presence any of the above chalcogen precursor gases.

Direct exposure of the barrier material to the chalcogen precursor may advantageously achieve a highest chalcogen concentration within the barrier material, and/or form a metal chalcogenide layer of any thickness. Furthermore, subsequent thermal processing may not be needed to form a metal chalcogenide layer within the barrier material. However, the absence of fill material during chalcogen doping may also be contrary to achieving a highest chalcogen concentration after subsequent thermal processing at operation 280. For example, where the fill material can be doped with the chalcogen(s) at operation 215 more readily than can the barrier material itself, a higher final chalcogen dopant concentration and/or more extensive metal chalcogenide conversion may be possible for methods 201 (FIG. 2A). Hence, either of methods 201 or 202 (FIG. 2B) may be preferable for a given combination of fill material and barrier material.

FIGS. 3A, 4A, 5A, and 6A illustrate a plan view of a portion of an IC interconnect structure 301 evolving as the methods 201 are practiced, in accordance with some dual-damascene embodiments. FIGS. 3B, 4B, 5B and 6B further illustrate a cross-sectional view of a portion of IC interconnect structure 301 evolving, in accordance with some dual-damascene embodiments.

Figure 3A:
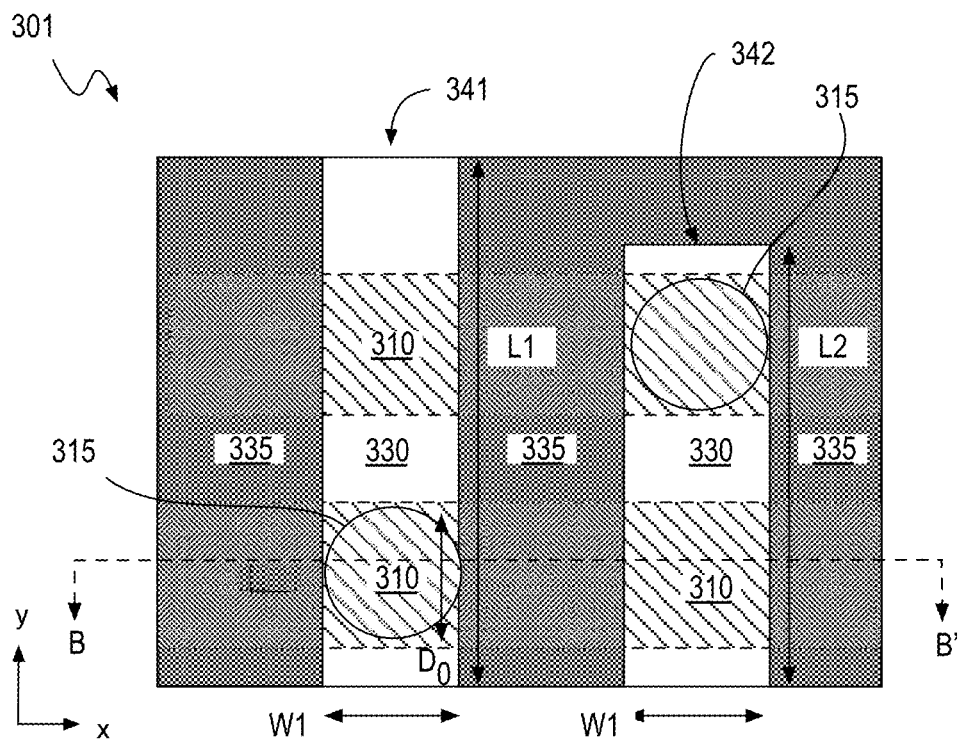
FIGS. 3A, 4A, 5A, and 6A illustrate a plan view of a portion of an IC interconnect structure evolving as the methods illustrated in FIG. 2A are practiced, in accordance with some dual-damascene embodiments.
Figure 3B:
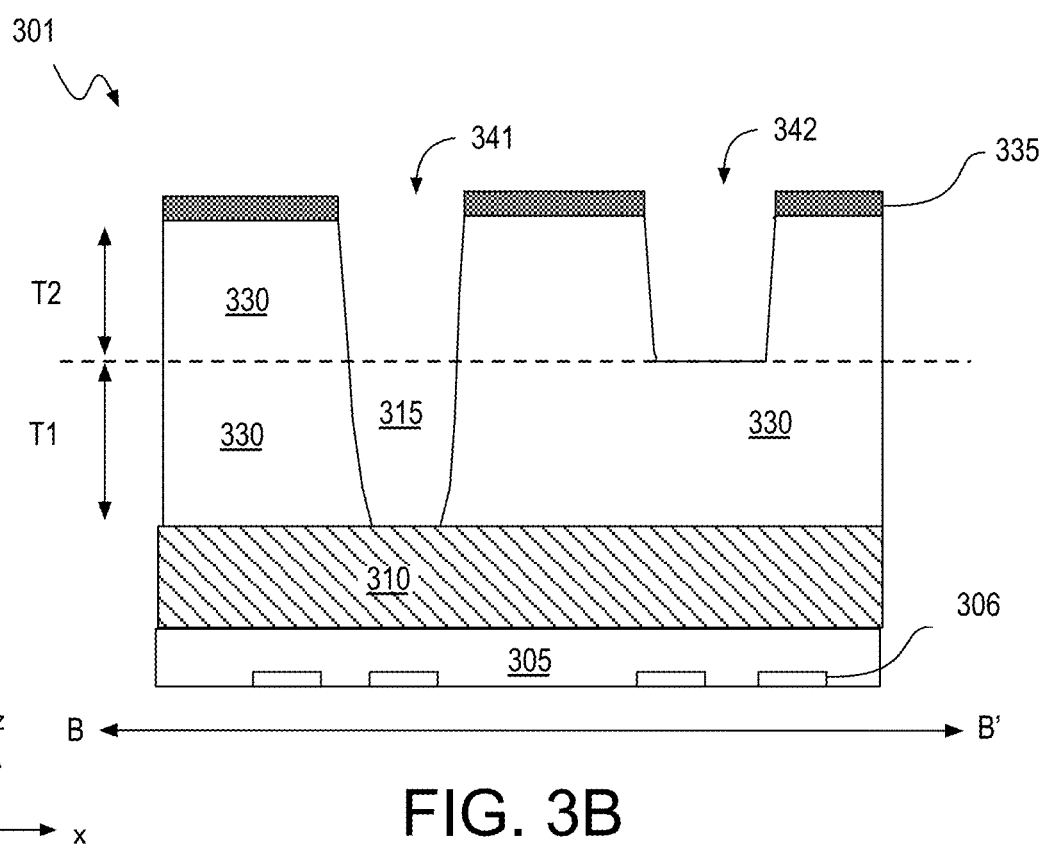
FIGS. 3B, 4B, 5B and 6B illustrate a cross-sectional view of a portion of an IC interconnect structure evolving as the methods illustrated in FIG. 2A are practiced, in accordance with some dual-damascene embodiments.

Referring first to FIG. 3A and FIG. 3B, interconnect structure 301 includes a via opening 315 through a thickness T1 of one or more dielectric materials 330. Thickness T1 may vary with implementation, but in some exemplary embodiments is 10 nm-50 nm. An underlying metallization feature (e.g., a line) 310 is exposed at a bottom of via opening 315. Metallization feature 310 is in a lower interconnect level below dielectric materials 330. Metallization feature 310 may have any composition, with some examples including copper, tungsten, titanium, cobalt, ruthenium, manganese, or aluminum. In FIG. 3A, portions of metallization feature 310 outlined in dashed line are below the surface.

Interconnect structure portion 301 further includes trench 341 over via opening 315, within a thickness T2 of dielectric materials 330. Thickness T2 may vary with implementation, but in some exemplary embodiments is 10-50 nm, or more. Another trench 342 laterally spaced apart from trench 341 is further illustrated, and the cross-section of trench 342 shown in FIG. 3B is representative of a cross-section of trench 341 out of the plane of the FIG. 3B where there is no via opening 315. As shown in FIG. 3A, trench 341 has a longitudinal length L1 and a transverse width W1. In exemplary embodiments, longitudinal length L1 is significantly (e.g., 3×) larger than transverse width W1. Although not illustrated, trench 341 has ends somewhere beyond the perimeter of interconnect structure portion 301. Trench 342 is substantially parallel to trench 341, but with a shorter longitudinal length L2 to further illustrate a trench end. An etch stop material layer 335 is over dielectric materials 330, surrounding trenches 341, 342. Via opening 315 has a maximum lateral diameter DO, which may vary with implementation, but is generally significantly smaller than the length of a trench (e.g., diameter DO is significantly smaller than longitudinal lengths L1 and L2).

Any single-step or multi-step anisotropic reactive ion etch (RIE) process (e.g., based on a CxFy plasma chemistry) may have been practiced to form trenches 341, 342 and via opening 315, as embodiments are not limited in this respect. Trenches 341, 342 and via opening 315 are depicted with a tapered sidewall and positive slope such that a top width of via opening 315 is slightly larger than the bottom width. While such tapered slope is representative of subtractively patterned dielectrics, other profiles are possible as a function of the dielectric etch process.

Dielectric materials 330 may include any dielectric material suitable for electrical isolation of integrated circuitry. Dielectric materials 330, may, for example, be low-k dielectric materials (e.g., SiOC) having a relative permittivity below 3.5. In other examples, dielectric materials 330 may be any of SiO, SiON, hydrogen silsesquioxane, methyl silsesquioxane, polyimide, polynorbornenes, benzocyclobutene, or the like. Dielectric materials 330 may be deposited as a flowable oxide, for example, and have a substantially planar top surface. Etch stop material layer 335 may also be a dielectric material, but advantageously has a different composition than dielectric materials 330. Etch stop material layer 335 may have a somewhat higher relative permittivity than dielectric materials 330, for example. Etch stop material layer 335 may have any composition such as, but not limited to, SiN, SiO, SiON, HfO2, ZrO, Al2O3, for example. Etch stop material layer 335 may have any thickness, but in some advantageous embodiments has a thickness less than 10 nm, and advantageously no more than 5 nm (e.g., 2-3 nm, etc.). In accordance with some further embodiments, dielectric materials 330 may further include an intervening trench etch stop material layer represented as a dashed line between dielectric material thicknesses T1 and T2.

As further shown in FIG. 3B, interconnect structure portion 301 is over a portion of an underlying substrate that includes a device layer 305. Within device layer 305 are a plurality of devices 306. In exemplary embodiments, devices 306 are metal-oxide-semiconductor field effect transistor (MOSFET) structures. However, devices 306 may also be other transistor types, such as, but not limited to other FET architectures, or bipolar junction transistors. Devices 306 may also be other devices that include one or more semiconductor junctions (e.g., diodes, etc.).

Figure 4A:
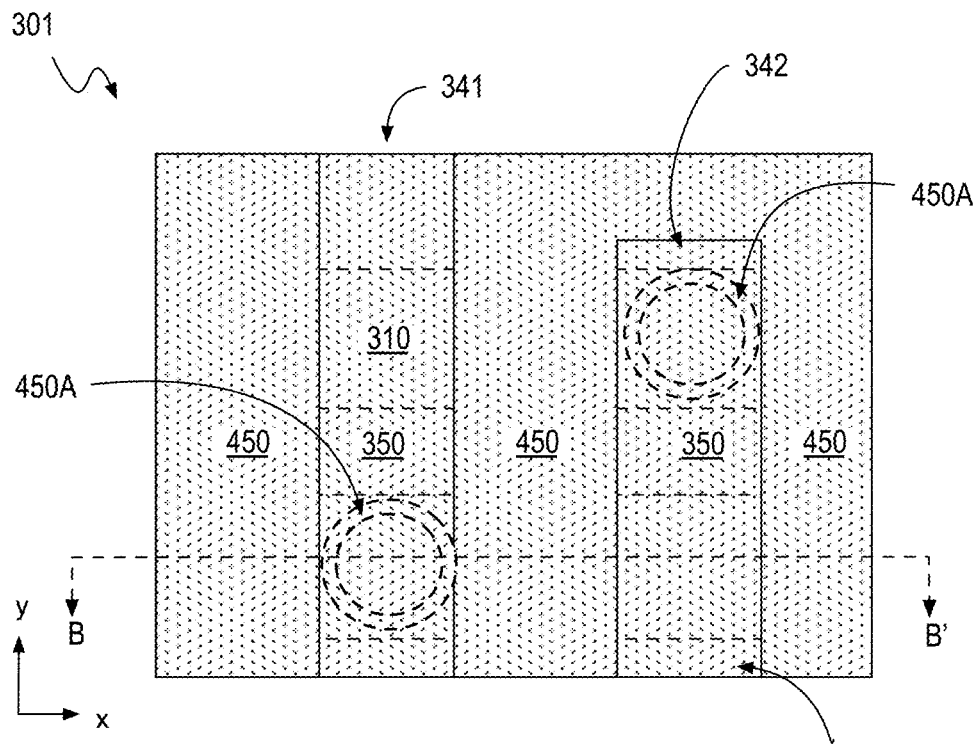
Figure 4B:
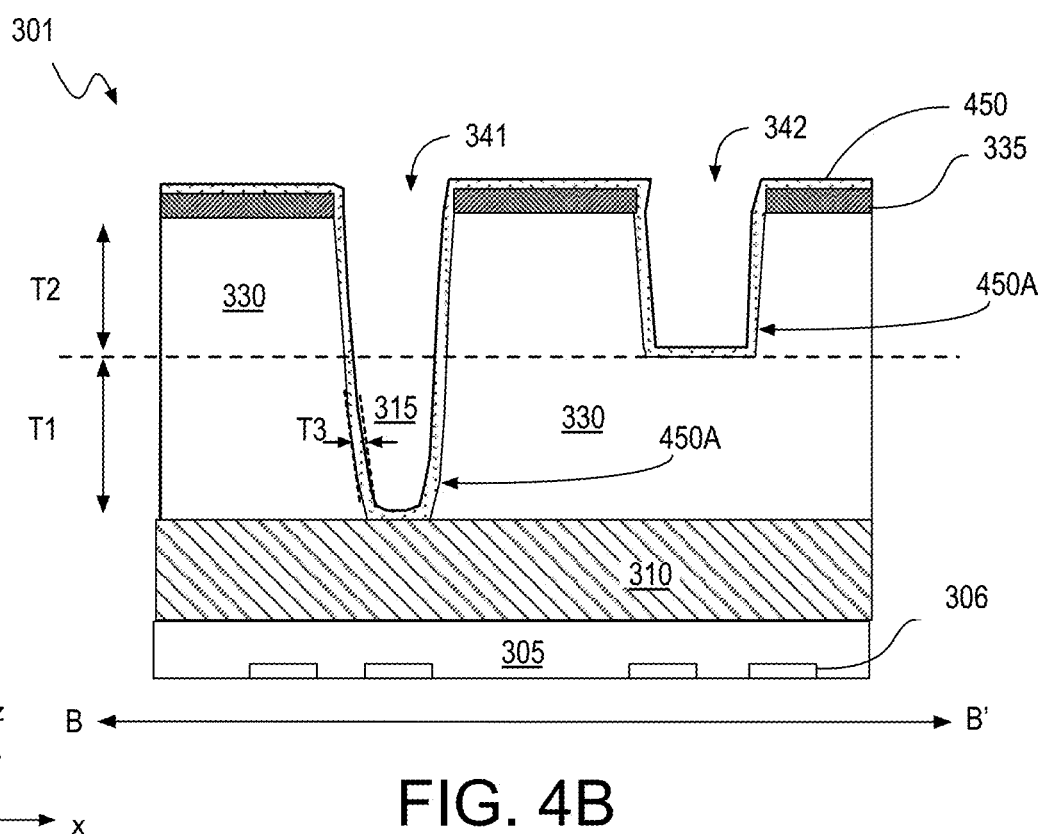

In the example further illustrated in FIG. 4A and FIG. 4B, a barrier material 450 has been formed over interconnect structure portion 301. As shown, barrier material 450 includes a sidewall barrier region 450A within both trench 342 and via opening 315. Sidewall barrier region 450A has a thickness T3. In exemplary embodiments, thickness T3 is insufficient for barrier material 450 to adequately function as a robust diffusion barrier material layer. In some exemplary embodiments, sidewall thickness T3 no more than 2 nm, and advantageously less than 2 nm (e.g., 1-2 nm).

Barrier material 450 has any composition known to be suitable as a diffusion barrier at some threshold thickness greater than T3. In some examples, barrier material 450 comprises a metal, such as, but not limited to, Ta, Mo, W, or Al. Barrier material 450 may also comprise a metal compound that further includes at least one of Si, N, C, B, P or O. In some further embodiments, barrier material 450 further comprises nitrogen (e.g., TaN, WN, etc.). Some portion of barrier material 450 may further include oxygen (e.g., TaNxOy). As deposited, barrier material 450 may be substantially amorphous or may be polycrystalline.

Figure 5A:
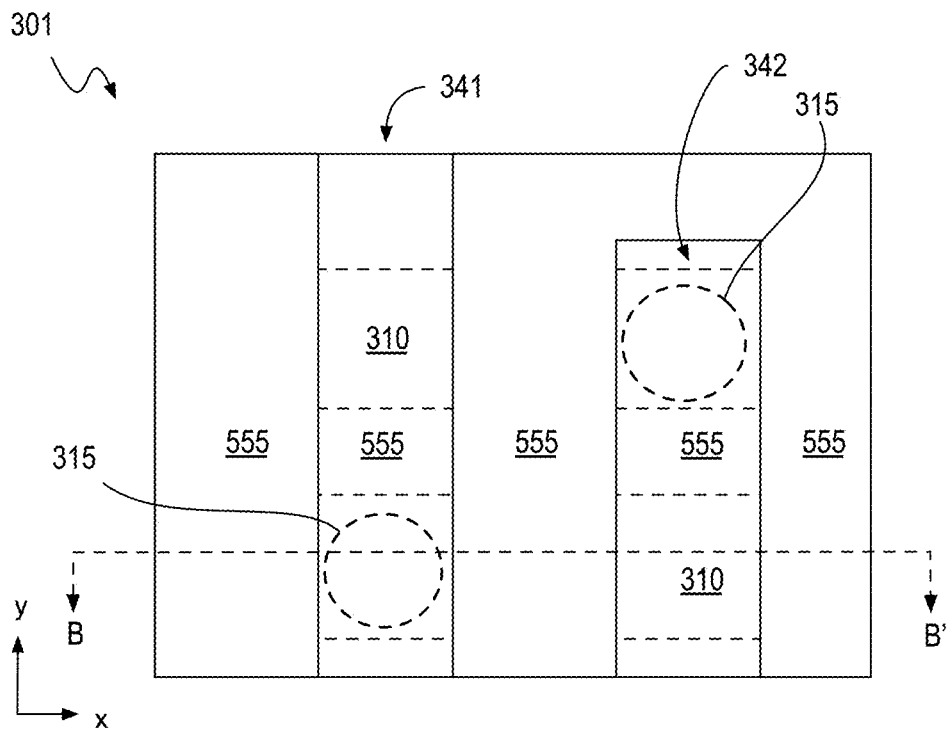
Figure 5B:
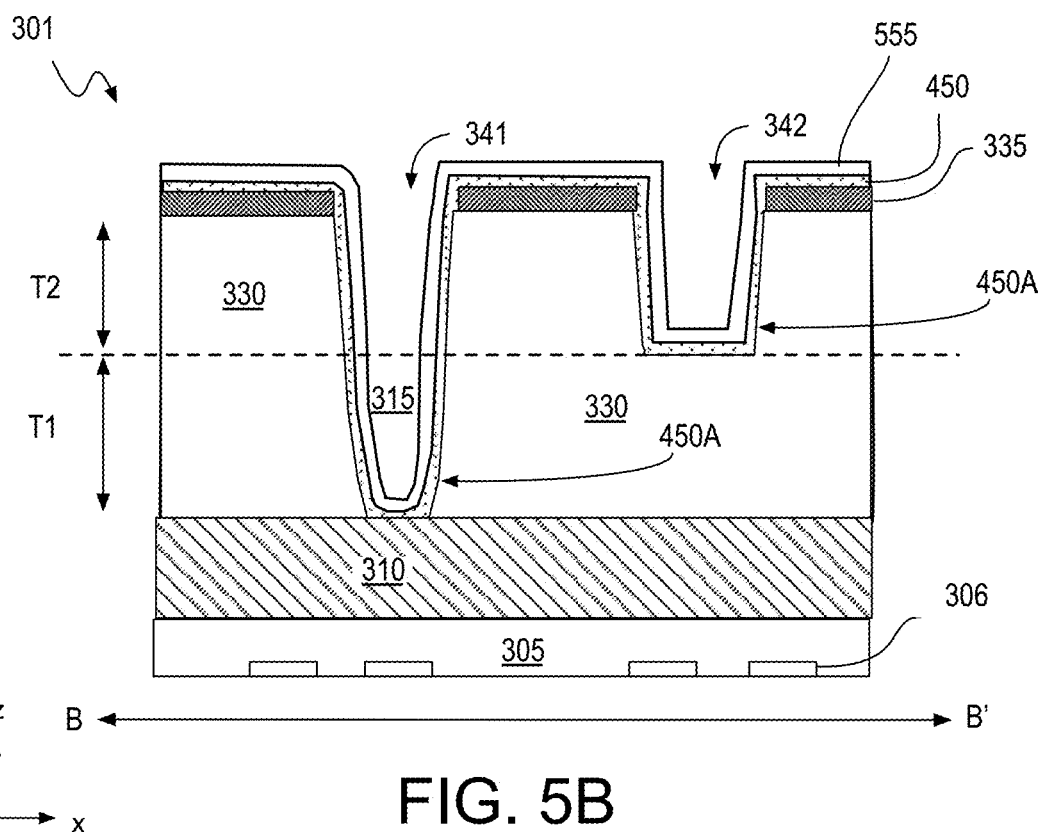

In the example further illustrated in FIG. 5A and FIG. 5B, interconnect structure 301 further includes an interconnect metal fill comprising a fill material layer 555. Fill material layer 555 may be any metal that may enhance properties of another fill material. Fill material layer 555 may, for example, function as a wetting layer improving the fill of another fill material subsequently deposited. In some embodiments, fill material layer 555 comprises predominantly cobalt. In the illustrated embodiments, fill material layer 555 is in physical contact with barrier material 450, but there may also be some intervening material layer. Although fill metal material layer 555 is shown as a substantially conformal layer, it may instead completely fill via opening 315 and/or trenches 341 and 342, for example as a function of the thickness of fill material layer 555 and the lateral dimensions of via opening 315 and/or trenches 341, 342.

Figure 6A:
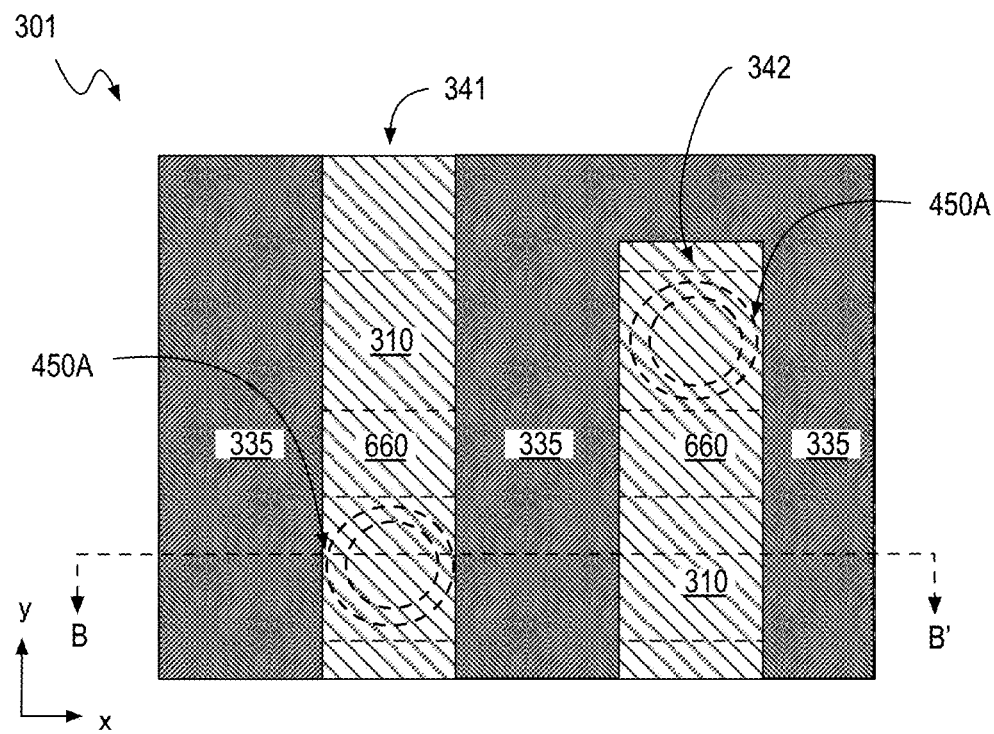
Figure 6B:
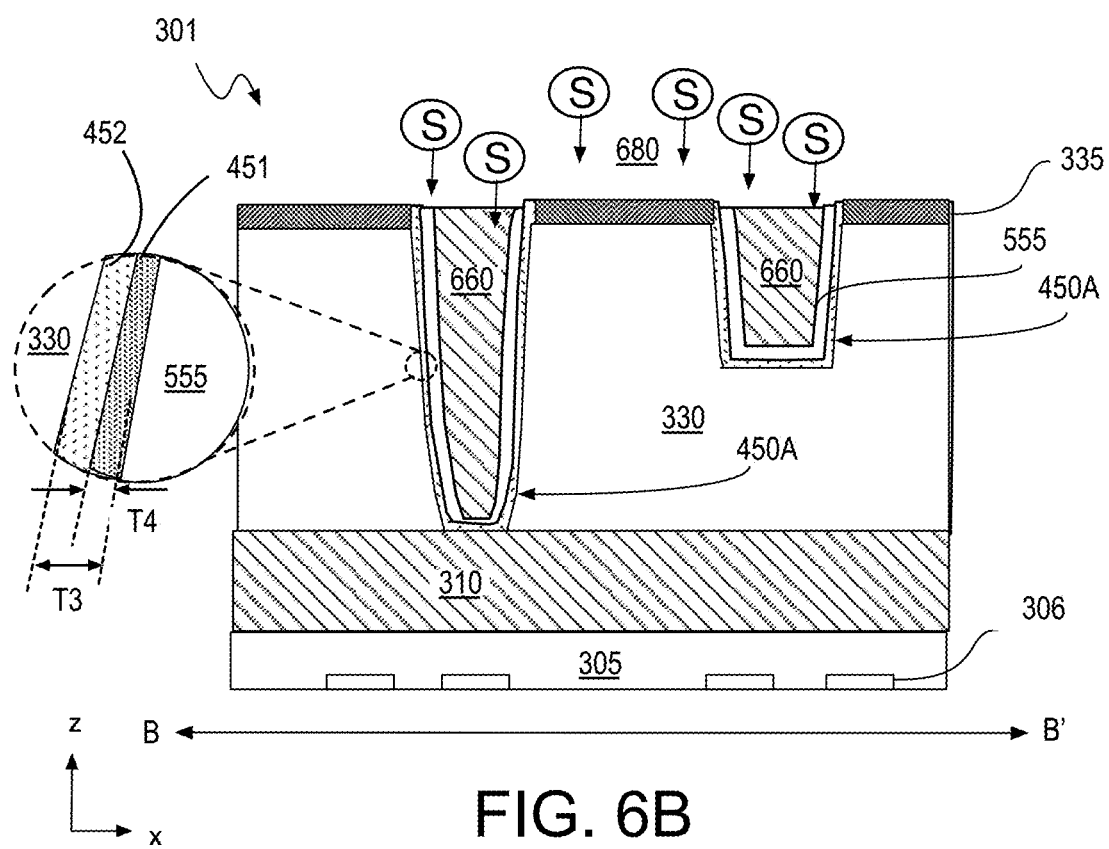

In the example further illustrated in FIG. 6A and FIG. 6B, another fill material layer 660 substantially backfills both via opening 315 and trenches 341 and 342. In some embodiments, fill material layer 660 comprises predominantly copper, or an alloy thereof. Although two metal fill layers 555 and 660 are illustrated, in alternative embodiments fill material 660 is instead in physical contact with barrier material 450. Fill material layers 555 and 660, as well as barrier material 450 are substantially planar with a top surface of the workpiece (e.g., etch stop layer 335).

FIG. 6B further illustrates introduction of an exemplary chalcogen precursor species (e.g., sulfur ions, radicals, etc.) 680 into interconnect structure 301. Chalcogen dopants that enter interconnect structure 301 have high mobility within the fill material and/or barrier material and come to rest in lowest energy states. The inventors have determined the highest chalcogen concentrations can occur at the interface of barrier material 450 and fill material (e.g., 555) and can also occur anywhere within barrier material 450 may oxygen is present. Oxygen may be most prevalent at the interconnect of barrier material 450 and fill material layer 555 for example where a native oxide was allowed to form on barrier material 450 before the deposition of fill material layer 555. In regions having sufficiently high chalcogen concentrations, metal from the barrier material can form a metal chalcogenide. For an exemplary embodiment where barrier material 450 comprises TaN, the chalcogen dopant may advantageously reach a sufficiently high concentration to form a tantalum chalcogenide layer. The same may occur for a barrier material comprising predominantly (e.g., substantially pure) Ta. The tantalum chalcogenide may be a dichalcogenide (TaS2), but need not be a dichalcogenide.

Neither chalcogen doping nor the formation of a metal chalcogenide layer within barrier material 450 has been found to significantly increase barrier material thickness T3. Instead, if a metal chalcogenide layer is formed, it will occupy some converted portion of thickness T3. As further shown in the expanded view inset of FIG. 6B, for embodiments where less than the full as-deposited barrier thickness T3 is converted, a metal chalcogenide layer 451 is formed within a partial thickness of barrier material where the chalcogen doping is greatest. In the illustrated example, metal chalcogenide layer 451 has a thickness T4 significantly less than thickness T3. Hence, for embodiments where barrier material thickness T3 is no more than 2.0 nm, thickness T4 may be, for example, no more than 1.0 nm, and is advantageously less than 1.0 nm. The remaining thickness of barrier material 452 (i.e., T3-T4) comprises chalcogen impurities at some lower concentration in the metal/metallic compound (e.g., TaN:S). For the example of TaN and S, the inventors have found metal chalcogenide layer 451 to form proximal to the interface of the barrier material and the fill material (e.g., fill material layer 555). Where chalcogen concentration is sufficient throughout the entire barrier material thickness T3, metal chalcogenide layer 451 may occupy the entire thickness T3 (i.e., T4=T3). Hence, for the example of Ta and S, the entire thickness of the Ta barrier may be converted from Ta:S into TaSx.

The microstructure of metal chalcogenide layer 451 may be distinct from that of both barrier material 452 and fill material layer 555. Crystallinity of metal chalcogenide layer 451 may become greater than that of the barrier material, for example as M:S converts to MSx. Similar to graphene, metal chalcogenides may have a crystalline microstructure that, at least in part, contributes to good line barrier properties even at thicknesses below 2 nm (e.g., 1 nm). Mobile constituents of a fill material (e.g., Cu) may be unable to traverse such a crystalline barrier. Although the inventors have observed that chalcogen doping of barrier material improves barrier performance, there may also be some advantages attributable to the microstructure of a metal chalcogenide layer. Relative to a reference barrier material of thickness T3) an improvement in diffusion barrier performance has also been observed for a barrier material of thickness T3 that comprises a metal chalcogenide layer of some thickness T4.

FIGS. 7A, 8A, 9A, 10A and 11A illustrate a plan view of a portion of an IC interconnect structure 701 evolving as methods 202 are practiced, in accordance with some single-damascene embodiments. FIGS. 7B, 8B, 9B, 10B and 11BA further illustrate a cross-sectional view of a portion of an IC interconnect structure 701, in accordance with some embodiments. Reference numbers are retained where one or more of the attributes introduced above are also applicable to interconnect structure 701. While methods 202 are illustrated in the context of a single-damascene structure, this is merely for the sake of illustrating multiple embodiments because either of methods 201 and 202 may be practiced to fabricate either dual-damascene or single-damascene interconnect structures.

Figure 7A:
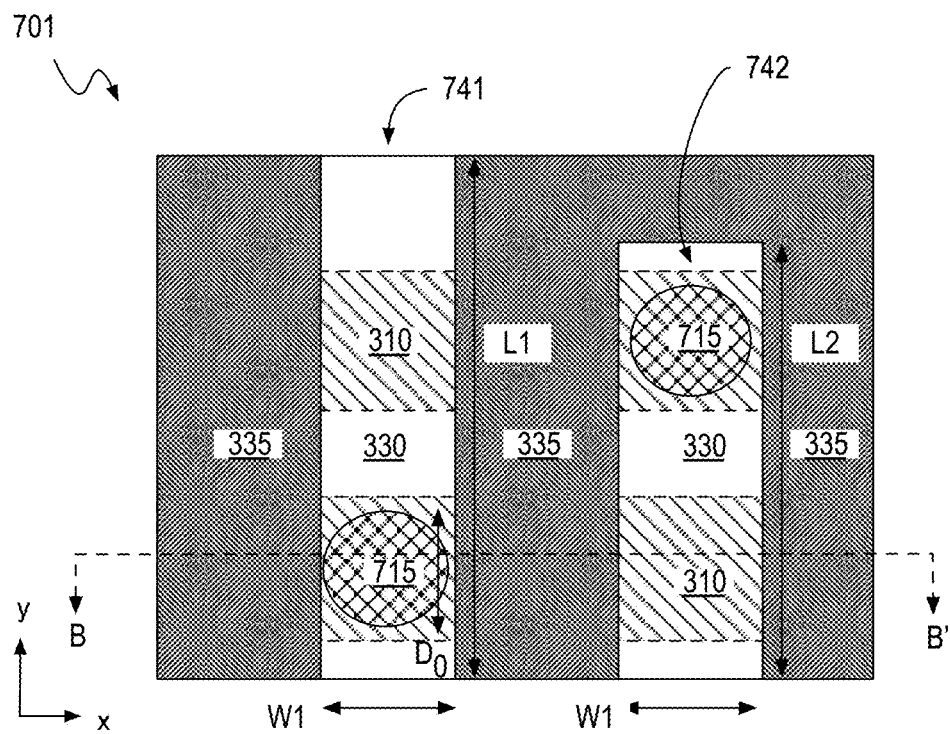
FIGS. 7A, 8A, 9A, and 10A illustrate a plan view of a portion of an IC interconnect structure evolving as the methods illustrated in FIG. 2B are practiced, in accordance with some single-damascene embodiments.
Figure 7B:
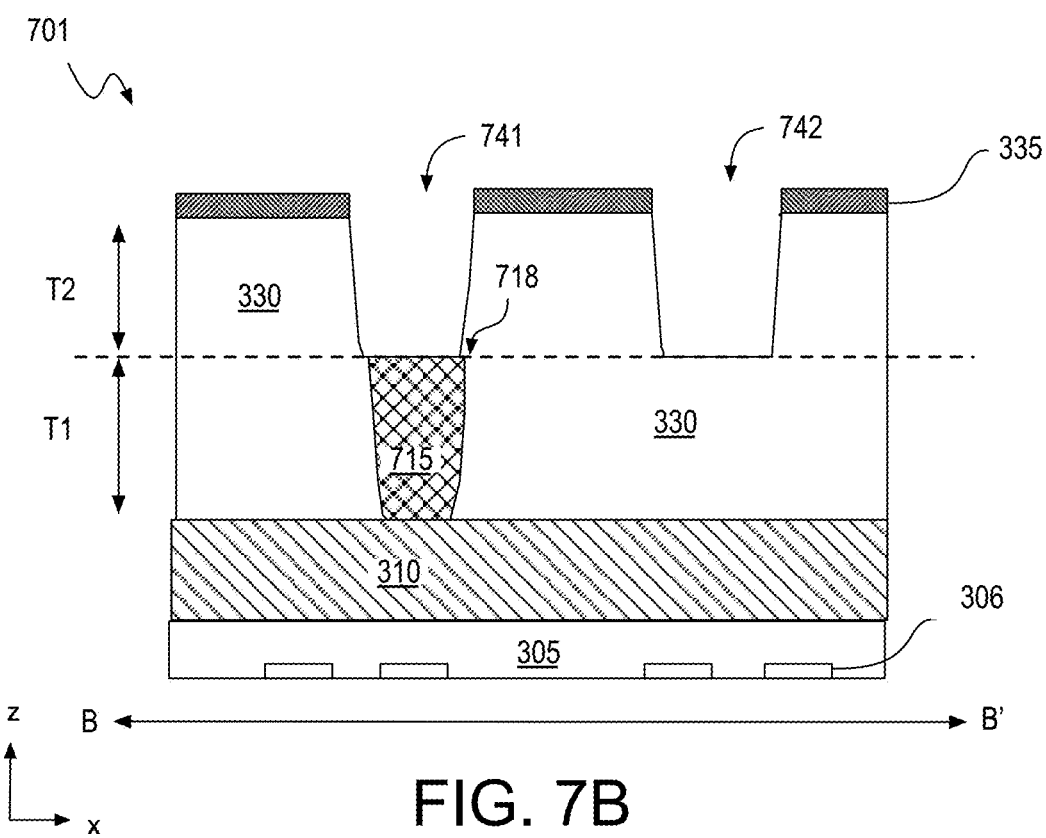
FIGS. 7B, 8B, 9B, and 10B illustrate a cross-sectional view of a portion of an IC interconnect structure evolving as the methods illustrated in FIG. 2B are practiced, in accordance with some single-damascene embodiments.

Referring first to FIG. 7A and FIG. 7B, interconnect structure 701 includes a via 715 extending through a thickness T1 of one or more dielectric materials 330. Via 715 comprises a fill material that is electrically coupled to underlying metallization feature 310. Via 715 may have been fabricated according to a first single-damascene process, for example. Via 715 has no barrier material, and may comprise any fill material suitable for a barrier-less via, such as, but not limited to, tungsten, molybdenum, titanium, cobalt, or ruthenium, for example. Without a barrier material, the via fill material is in physical contact with metallization feature 310. A top surface of via 715 is exposed at a bottom of trench 741 patterned into dielectric materials 330. As a result of separate patterning of via 715 and trench 741, there is a non-zero lateral offset or profile discontinuity 718 at the interface of the sidewall of trench 741 and a sidewall of via 715. Etch stop material layer 335 is again over dielectric materials 330, surrounding trenches 341, 342. As further shown in FIG. 7B, interconnect structure portion 701 is again over a portion of an underlying substrate that includes a device layer 305. Within device layer 305 are a plurality of devices 306.

Figure 8A:
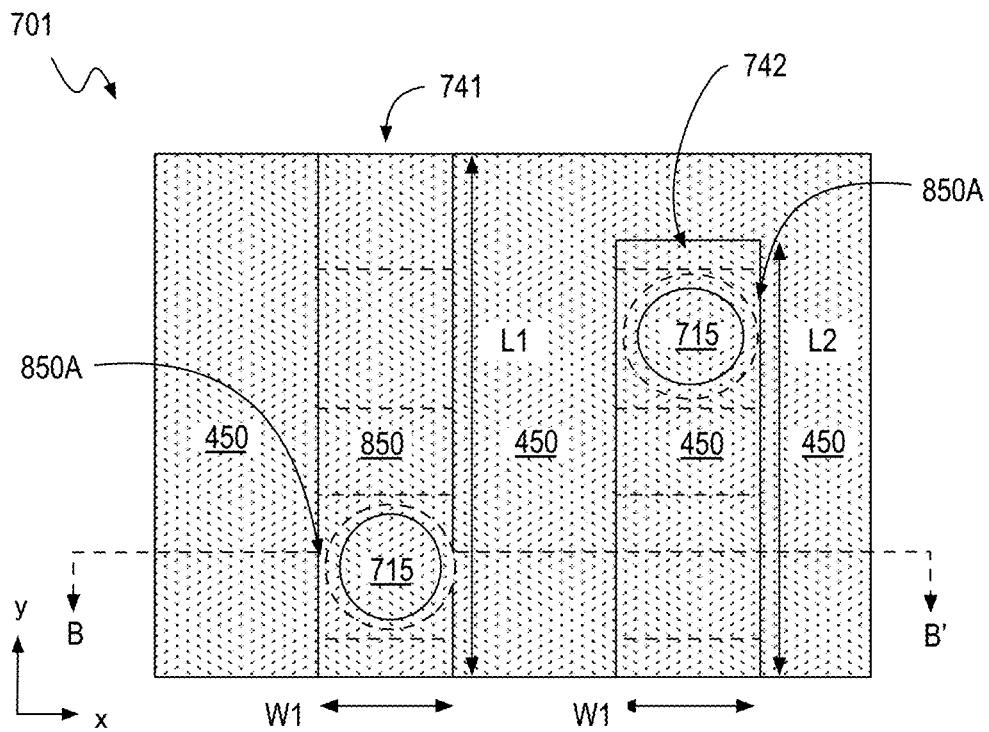
Figure 8B:
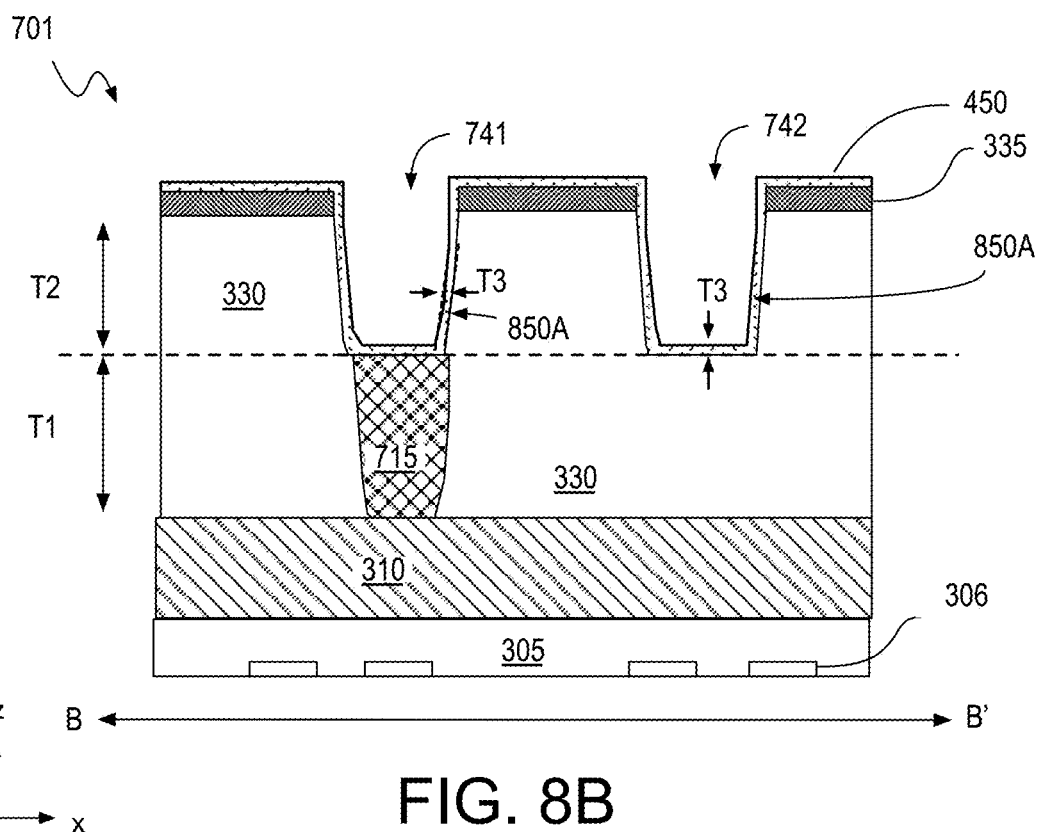
Figure 9A:
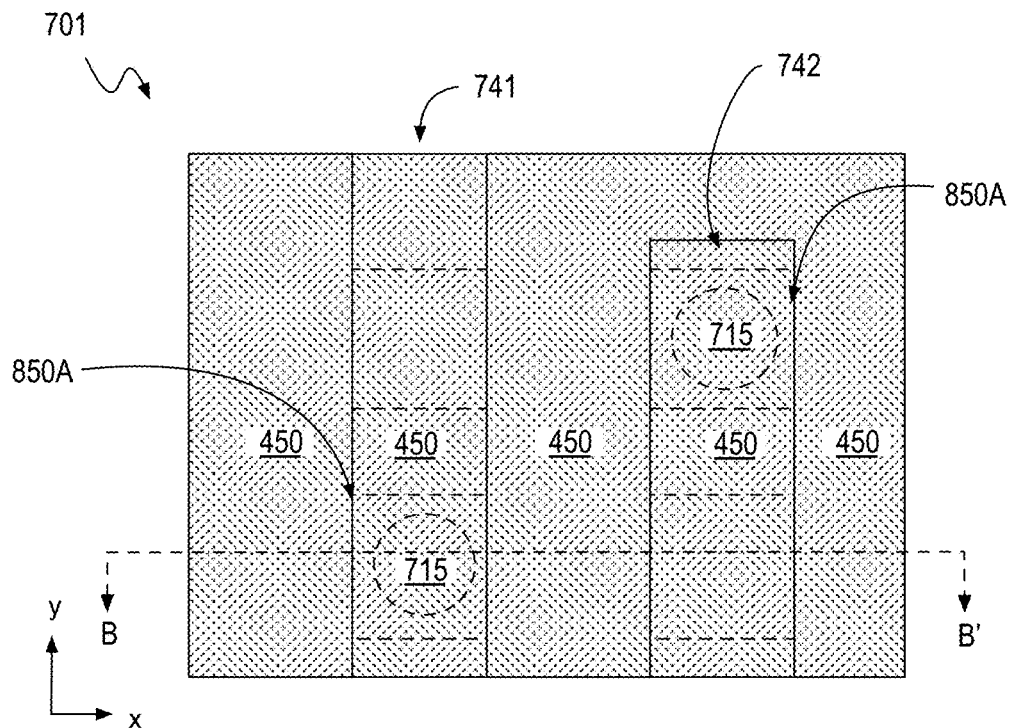
Figure 9B:
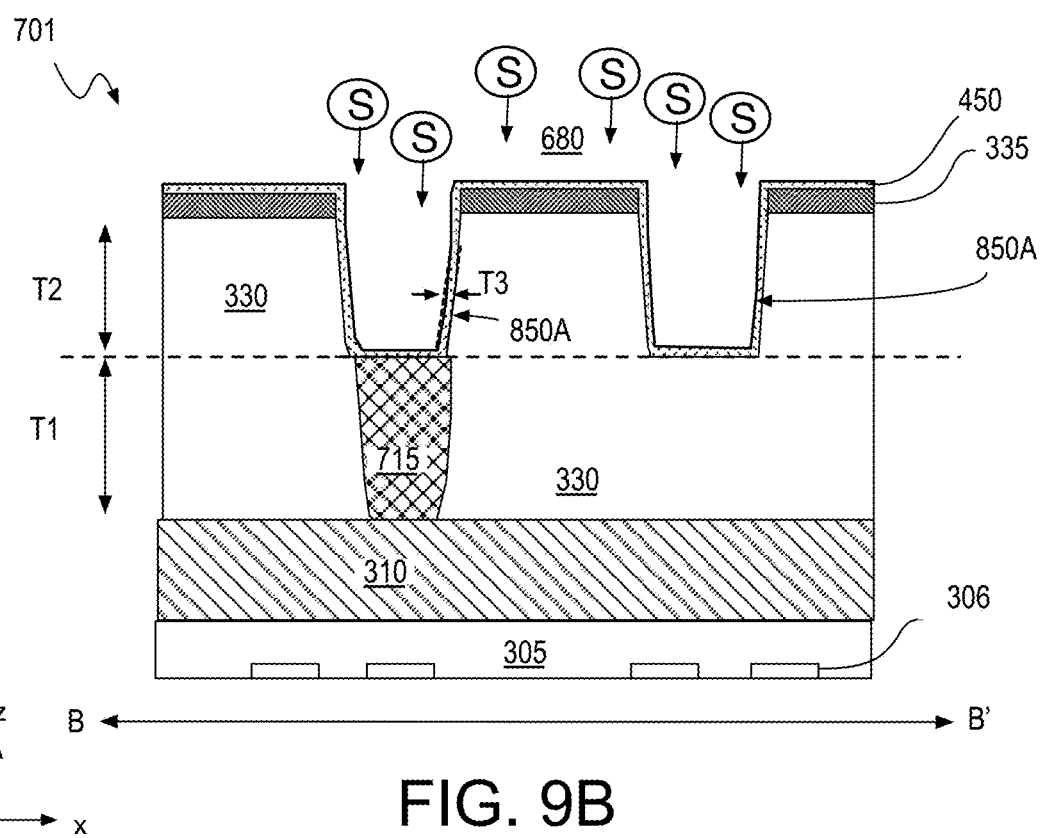

In the single-damascene example further illustrated in FIG. 8A and FIG. 8B, barrier material 450 includes a barrier sidewall region 850A adjacent to dielectric sidewall surfaces of trenches 341,342. Barrier sidewall region 850A has thickness T3, which again may be insufficient to function as a robust diffusion barrier material layer. Barrier material 450 may have any of the compositions described above in the context of a dual-damascene interconnect structure. As shown in FIGS. 9A and 9B, sulfur dopant species 680 are introduced into barrier material 450 prior to the deposition of a fill material and prior to a damascene planarization process.

Figure 10A:
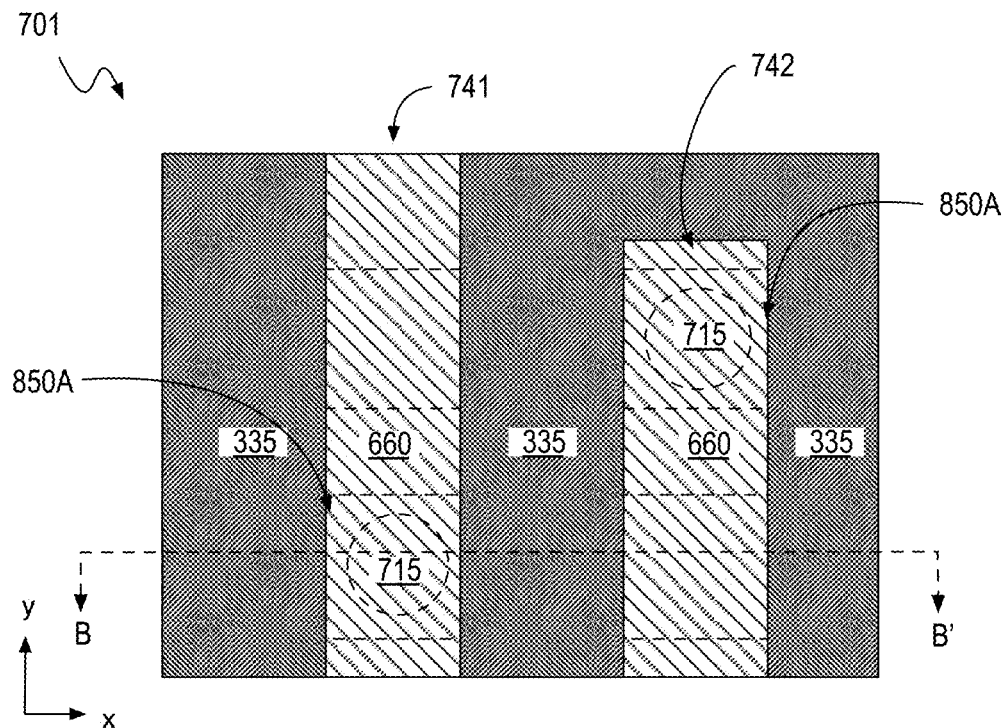
Figure 10B:
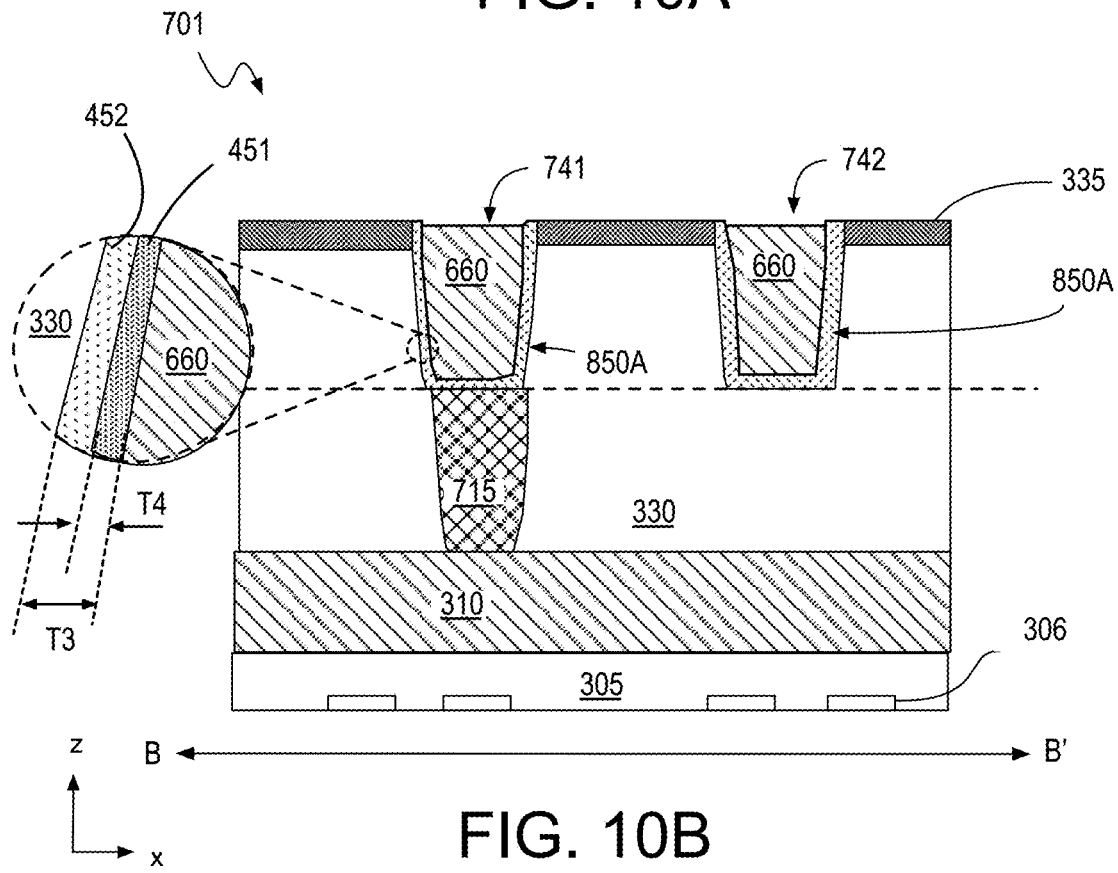

As further illustrated in FIG. 10A and FIG. 10B, the interconnect fill includes only fill material layer 660, which is in physical contact with barrier material 450, and substantially backfills trenches 341 and 342. Fill material layer 660 and barrier material 450 are substantially co-planar with a top surface of the workpiece (e.g., etch stop layer 335). At some point during fabrication of an IC, subsequent to the formation of interconnect structure 701, a thermal processing induces chalcogen impurities to diffuse, and potentially react into a chalcogenide of a metal constituent in the barrier material. The expanded view inset of FIG. 10B illustrates embodiments where less than the full thickness T3 of a chalcogen doped barrier material is converted into metal chalcogenide layer 451. Metal chalcogenide layer 451 has a thickness T4 significantly less than thickness T3. For examples where barrier material thickness T3 is no more than 2.0 nm, thickness T4 may be, for example, no more than 1.0 nm, and is advantageously less than 1.0 nm. The remaining barrier material 452 comprises the chalcogen impurity at some lower concentration within the metal/metallic compound (e.g., TaN:S).

Figure 11A:
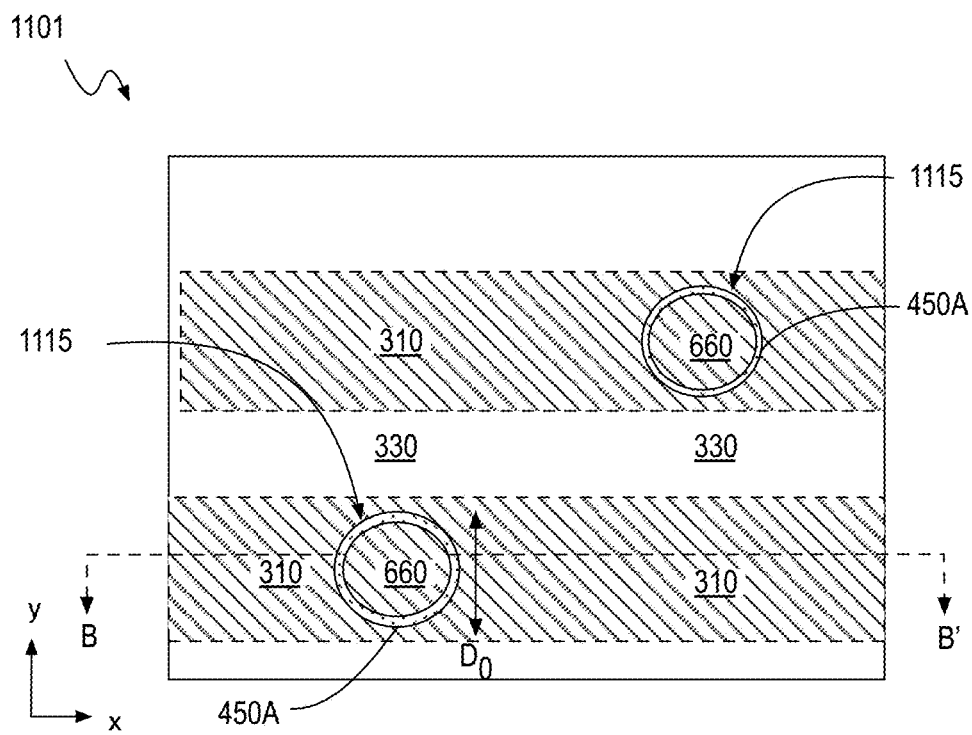
FIGS. 11A and 12A illustrate a plan view of a portion of an IC interconnect structure evolving as the methods illustrated in FIG. 2A are practiced, in accordance with some alternative single-damascene embodiments.
Figure 11B:
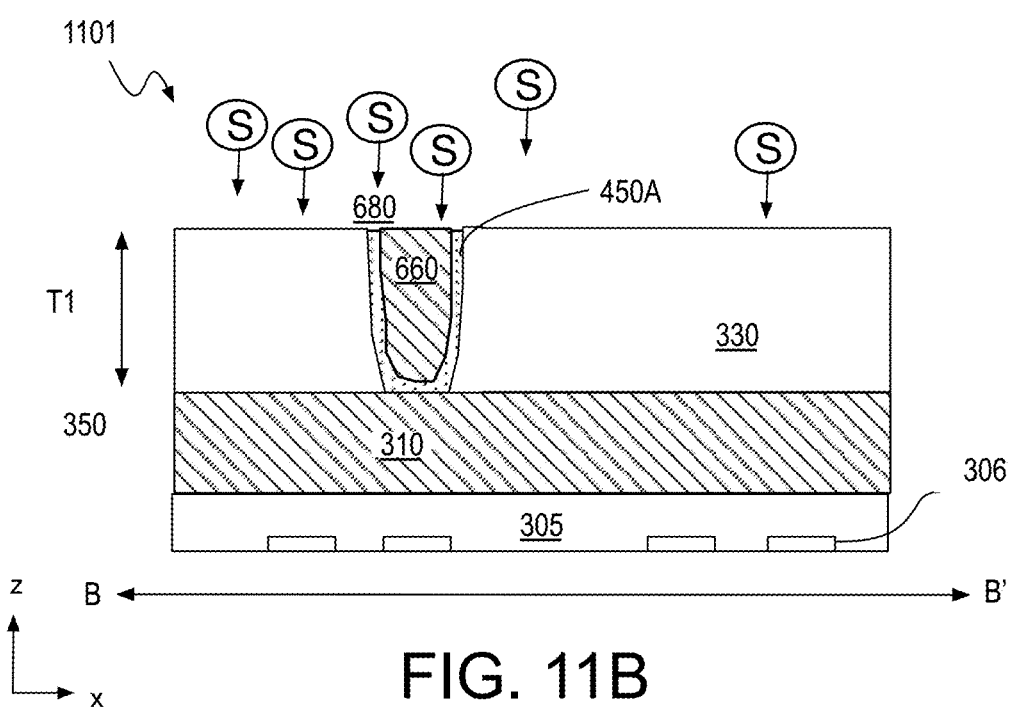
FIGS. 11B and 12B illustrate a cross-sectional view of a portion of an IC interconnect structure evolving as the methods illustrated in FIG. 2A are practiced, in accordance with some alternative single-damascene embodiments.
Figure 12A:
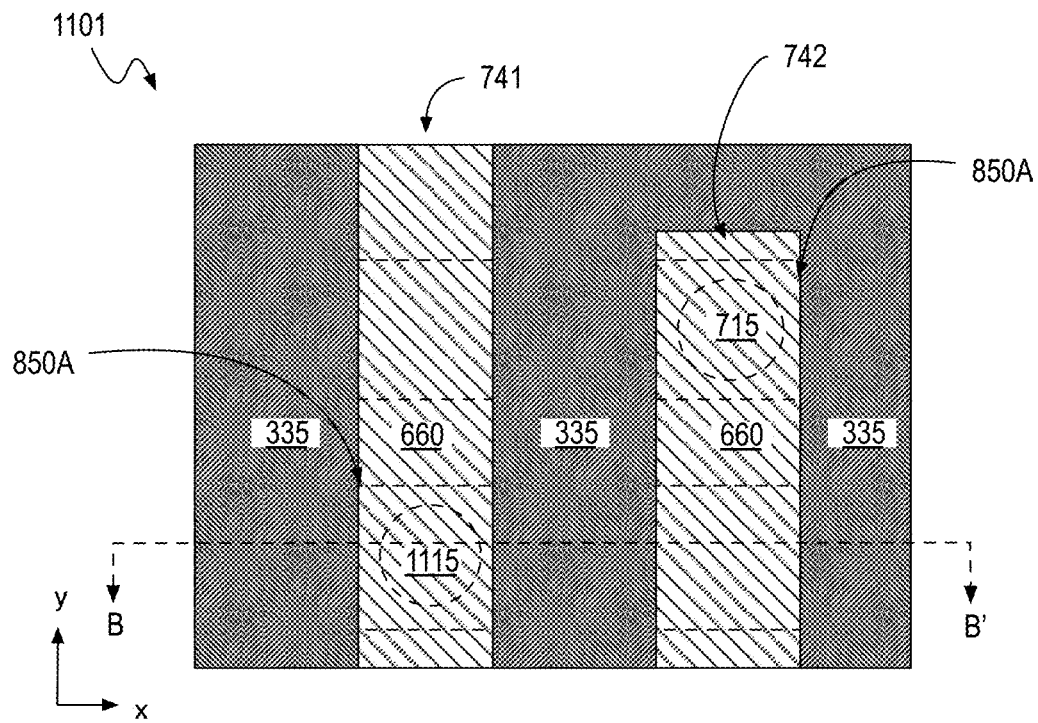
Figure 12B:
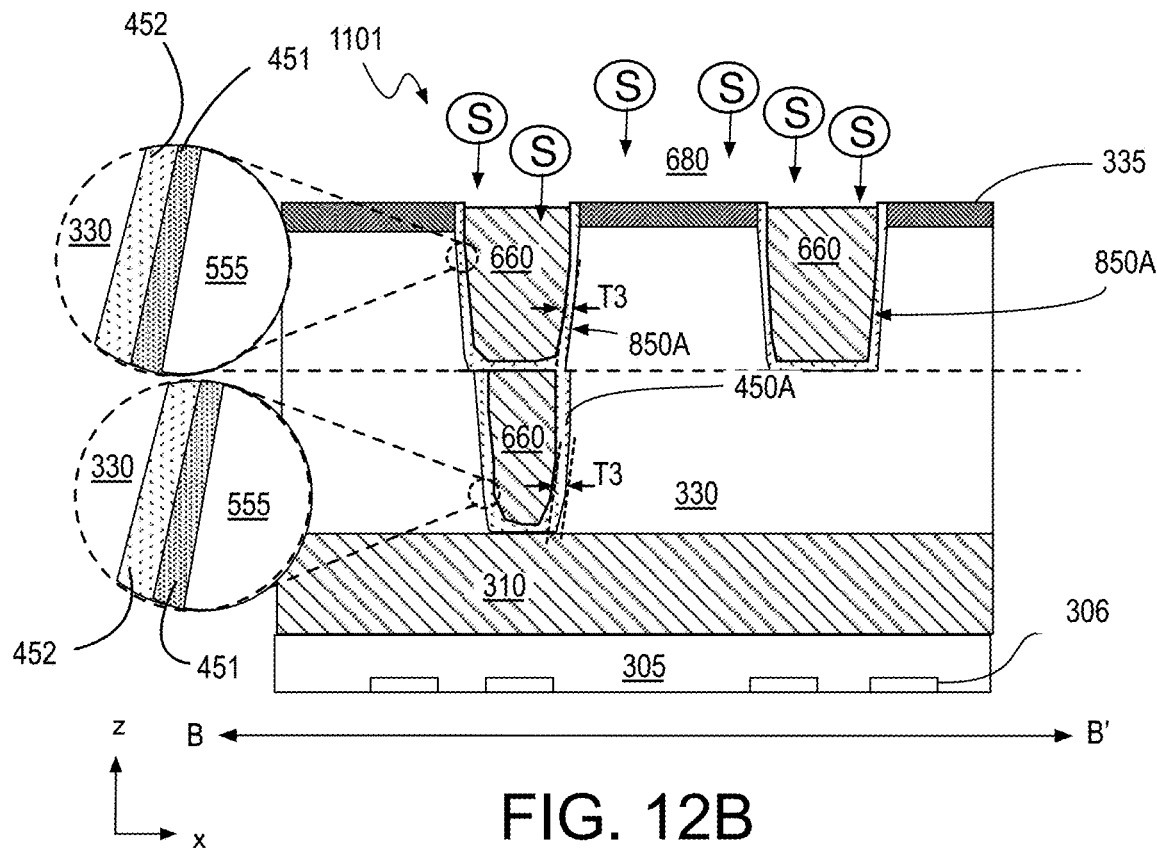

For some single-damascene structures, an interconnect line may have metal-chalcogen barrier, for example as illustrated in FIG. 7A-10. Some single-damascene structures may also include a via with an ultra-thin barrier. FIG. 11A and FIG. 12A illustrate a plan view of an interconnect structure 1101 evolving to include two metal-chalcogen barriers as methods 201 are iteratively practiced in accordance with some single-damascene embodiments. FIGS. 11B and 12B illustrate corresponding cross-sectional views of interconnect structure 1101.

As shown in FIG. 11A and FIG. 11B, interconnect structure 1101 includes via 1115 with fill material 660 surrounded by barrier sidewall region 450A. The exemplary sulfur dopant species 680 are introduced into barrier sidewall region 450A and into fill material 660 prior to, or subsequent to, a polish process that planarizes via 1115 with dielectric material 330. FIG. 12A and FIG. 12B illustrate single-damascene interconnect structure 1101 further including a trench with fill material 660 surrounded by barrier sidewall region 850A of thickness T3. Although via and trench barrier materials may be different, in some exemplary embodiments the two barrier materials have substantially the same composition (e.g., TaN). As further illustrated in FIG. 12B, sulfur dopant species 680 are introduced into barrier sidewall region 850A and fill material 660 within trenches 741, 742 prior to, or subsequent to, a polish process that planarizes interconnect lines with surrounding dielectric material 330. At any subsequent point in IC fabrication (e.g., at end-of-line), a thermal anneal may then be performed to diffuse and/or react the sulfur dopants into corresponding metal chalcogenide layers.

Interconnect structures 301, 701, or 1101 may each be incorporated into any IC circuitry as a portion of any IC chip or die that may be singulated from a workpiece following the completion of any conventional processing not further described herein. With a barrier material including an ultra-thin metal chalcogenide layer, barrier material thickness may be minimized to something less than a threshold minimum thickness otherwise needed to prevent metal fill diffusion. With the barrier material thickness thereby reduced, interconnect metallization resistance, and more particularly via electrical resistance, may be reduced. IC circuitry may therefore display an lower RC delay and higher overall performance. An IC may also display lower power consumption and lower temperatures for a given level of performance.

Figure 13:
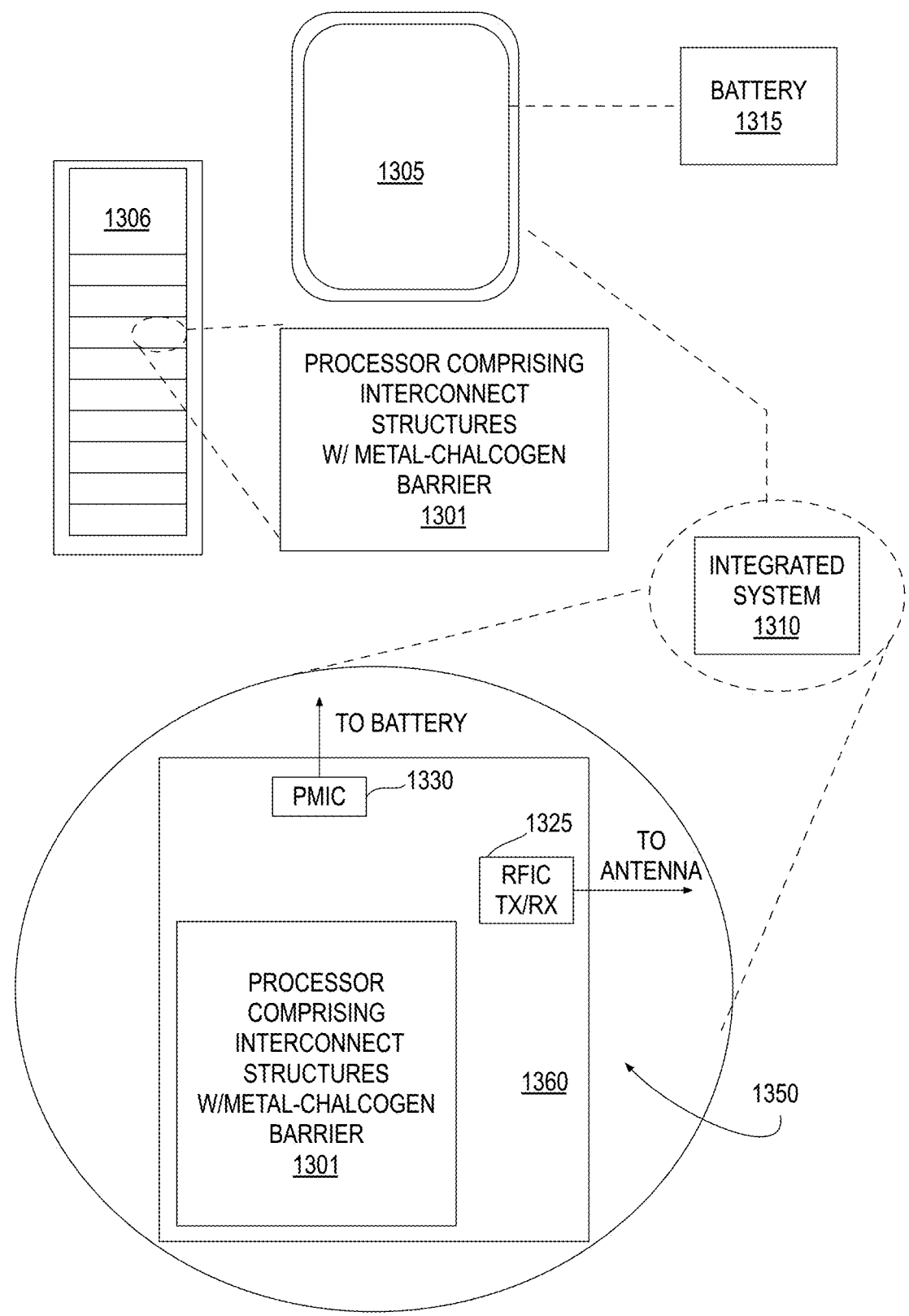
FIG. 13 illustrates a mobile computing platform and a data server machine employing an IC including an interconnect structure with a metal-chalcogen barrier material, in accordance with some embodiments.

FIG. 13 illustrates a mobile computing platform 1305 and a data server computing platform 1306 employing an IC including interconnect structures with low resistance vias, for example as described elsewhere herein. The server platform 1306 may be any commercial server, for example including any number of high-performance computing platforms disposed within a rack and networked together for electronic data processing, which in the exemplary embodiment includes a microprocessor 1301 including interconnect structures with low resistance vias, for example as described elsewhere herein.

The mobile computing platform 1305 may be any portable device configured for each of electronic data display, electronic data processing, wireless electronic data transmission, or the like. For example, the mobile computing platform 1305 may be any of a tablet, a smart phone, laptop computer, etc., and may include a display screen (e.g., a capacitive, inductive, resistive, or optical touchscreen), a chip-level or package-level integrated system 1310, and a battery 1315. At least one IC of chip-level or package-level integrated system 1310 includes an interconnect structure with metal-chalcogen barrier material, for example as described elsewhere herein. In the example shown in expanded view 1350, integrated system 1310 includes microprocessor 1301 including interconnect structures with low resistance vias, for example as described elsewhere herein. Microprocessor 1350 may be further coupled to a board 1360, a substrate, or an interposer. One or more of a power management integrated circuit (PMIC) 1330, or an RF (wireless) integrated circuit (RFIC) 1325 including a wideband RF (wireless) transmitter and/or receiver (TX/RX) may be further coupled to board 1360.

Functionally, PMIC 1330 may perform battery power regulation, DC-to-DC conversion, etc., and so has an input coupled to battery 1315 and with an output providing a current supply to other functional modules (e.g., microprocessor 1350). As further illustrated, in the exemplary embodiment, RFIC 1325 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 4G, 5G, and beyond.

Figure 14:
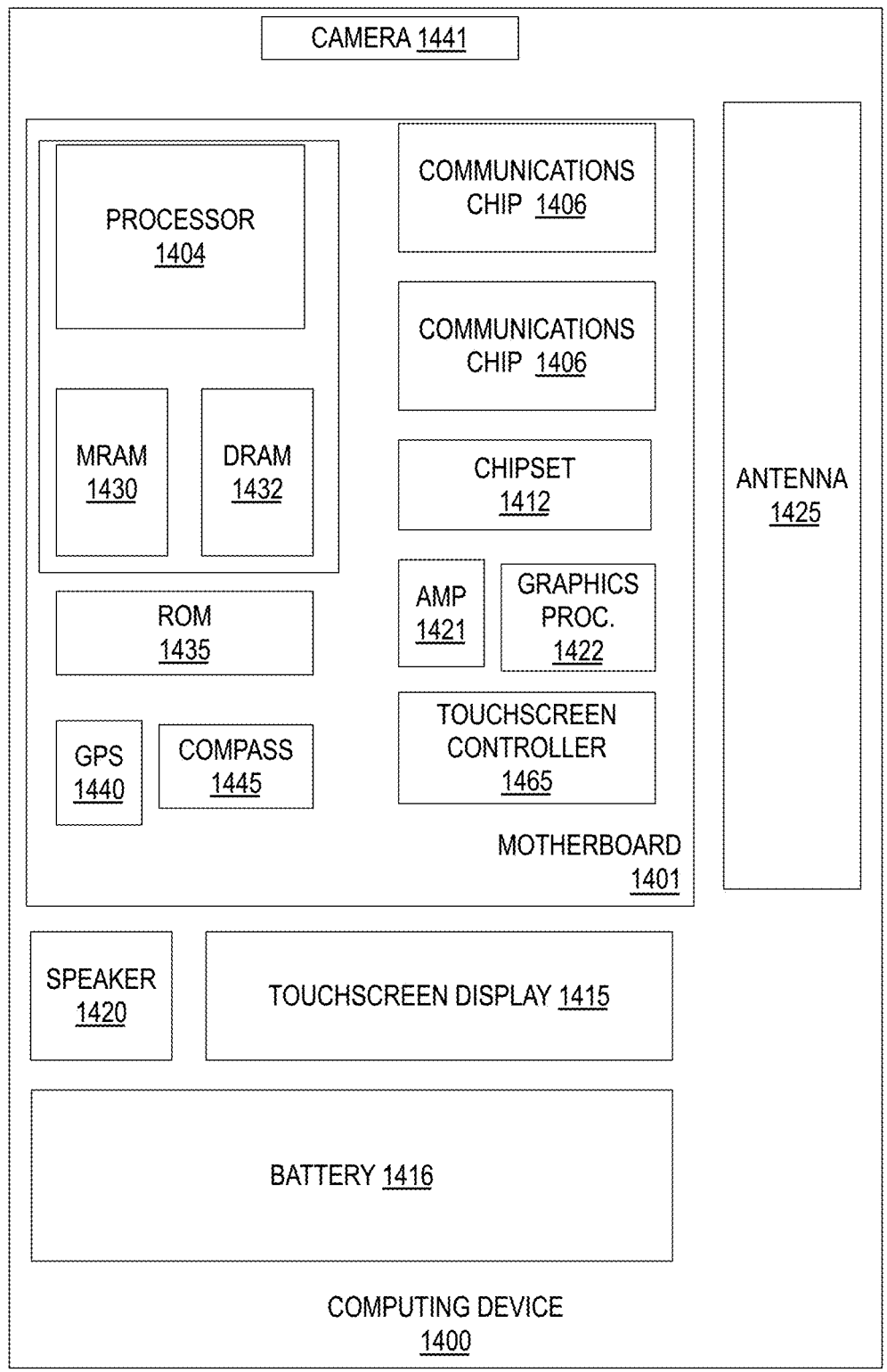
FIG. 14 is a functional block diagram of an electronic computing device, in accordance with some embodiments.

FIG. 14 is a functional block diagram of an electronic computing device 1400, in accordance with an embodiment of the present invention. Computing device 1400 may be found inside platform 1305 or server platform 1306, for example. Device 1400 further includes a motherboard 1401 hosting a number of components, such as, but not limited to, a processor 1404 (e.g., an applications processor). Processor 1404 may be physically and/or electrically coupled to motherboard 1401. In some examples, processor 1404 includes interconnect structures with low resistance vias, for example as described elsewhere herein. In general, the term "processor" or "microprocessor" may refer to any device or portion of a device that processes electronic data from registers and/or memory to transform that electronic data into other electronic data that may be further stored in registers and/or memory.

In various examples, one or more communication chips 1406 may also be physically and/or electrically coupled to the motherboard 1401. In further implementations, communication chips 1406 may be part of processor 1404. Depending on its applications, computing device 1400 may include other components that may or may not be physically and electrically coupled to motherboard 1401. These other components include, but are not limited to, volatile memory (e.g., DRAM 1432), non-volatile memory (e.g., ROM 1435), flash memory (e.g., NAND or NOR), magnetic memory (MRAM 1430), a graphics processor 1422, a digital signal processor, a crypto processor, a chipset 1412, an antenna 1425, touchscreen display 1415, touchscreen controller 1465, battery 1416, audio codec, video codec, power amplifier 1421, global positioning system (GPS) device 1440, compass 1445, accelerometer, gyroscope, speaker 1420, camera 1441, and mass storage device (such as hard disk drive, solid-state drive (SSD), compact disk (CD), digital versatile disk (DVD), and so forth), or the like. In some exemplary embodiments, at least one of the functional blocks noted above include interconnect structures with a metal-chalcogen barrier material, for example as described elsewhere herein.

Communication chips 1406 may enable wireless communications for the transfer of data to and from the computing device 1400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 1406 may implement any of a number of wireless standards or protocols, including but not limited to those described elsewhere herein. As discussed, computing device 1400 may include a plurality of communication chips 1406. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

It will be recognized that the invention is not limited to the embodiments so described, but can be practiced with modification and alteration without departing from the scope of the appended claims. For example the above embodiments may include specific combinations of features as further provided below.

In first examples, an integrated circuit (IC) interconnect structure comprises a line or via metallization within a dielectric material. The line or via metallization comprises a fill material comprising a first metal, and a barrier material between the fill material and the dielectric material. The barrier material comprises a second metal and one or more chalcogens.

In second examples, for any of the first examples the first metal is Co, Mo, W, or Cu.

In third examples, for any of the first through second examples the second metal Ta or W.

In fourth examples, for any of the first through third examples the one or more chalcogens comprise at least one of S or Se.

In fifth examples, for any of the first through fourth examples the barrier material further comprises nitrogen.

In sixth examples, for any of the first through fifth examples the IC interconnect structure further comprises a metal chalcogenide layer between the fill material and the dielectric material, wherein the metal chalcogenide layer comprises at least the second metal and the one or more chalcogens.

In seventh examples, for any of sixth examples the barrier material comprises predominantly Ta and N, and wherein the metal chalcogenide layer comprises predominantly Ta and at least one of S or Se.

In eighth examples, for any of the sixth examples the metal chalcogenide layer is between the fill material and the barrier material.

In ninth examples, for any of the sixth through eighth examples the barrier material has a first thickness, the metal chalcogenide layer has a second thickness, and wherein a sum of the first and second thicknesses is no more than 2 nm.

In tenth examples, for any of the ninth examples the second thickness less than 1 nm and wherein the metal chalcogenide layer has greater crystallinity than the barrier layer.

In eleventh examples, for any of the first through tenth examples the IC interconnect structure comprises a first line metallization under the dielectric material, a via metallization through the dielectric material, and coupled to the first line metallization, and a second line metallization over, and coupled to, the first line metallization through the via metallization. The second line metallization comprises the fill material and the a barrier material. The first metal is Cu.

In twelfth examples, a computer platform comprises a power supply, and an integrated circuit (IC) coupled to the power supply. The IC comprises a device layer comprising a plurality of transistors comprising one or more semiconductor materials, and a plurality of interconnect levels. The interconnect levels further comprise a first line metallization, a dielectric material over the first line metallization, a via metallization through the dielectric material, and coupled to the first line metallization, and a second line metallization over, and coupled to, the first line metallization through the via metallization. The second line metallization comprises a barrier material comprising a metal, nitrogen and one or more chalcogens.

In thirteenth examples, for any of the twelfth examples, the IC comprises a microprocessor.

In fourteenth examples, for any of the twelfth through thirteenth examples a metal chalcogenide layer is in physical contact with the barrier material, the metal chalcogenide layer comprising the metal and the one or more chalcogens.

In fifteenth examples, a method of fabricating an integrated circuit (IC) interconnect structure comprises forming at least one of a via opening or a trench in a dielectric material, depositing a barrier material on a surface of the dielectric material, the barrier material comprising a first metal. The method comprises depositing a fill material over the barrier material within the via opening or the trench, doping the barrier material with one or more chalcogens.

In sixteenth examples, for any of the fifteenth examples the method further comprises forming a metal chalcogenide layer by reacting the first metal with the one or more chalcogens.

In seventeenth examples, for any of the fifteenth through sixteenth examples depositing the barrier material comprises forming a metallic compound comprising predominantly Ta and N, and wherein reacting the first metal with the one or more chalcogens comprises reacting Ta with at least S.

In eighteenth examples, for any of the fifteenth through seventeenth examples doping the barrier material comprises heating the IC interconnect structure to a temperature over 100° C. in the presence of at least H2S.

In nineteenth examples, for any of the fifteenth through eighteenth examples reacting the first metal with the one or more chalcogens further comprises heating the IC interconnect structure to a temperature over 200° C.

In twentieth examples, for any of the fifteenth through nineteenth examples depositing the barrier material comprises forming a barrier material layer having a first thickness, and wherein forming the metal chalcogenide layer comprises converting a portion of the first thickness into the metal chalcogenide layer.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

What is claimed is:

1. An integrated circuit (IC) interconnect structure, comprising:
   a line or via metallization within a dielectric material, wherein the line or via metallization comprises:
   a fill material comprising a first metal; and
   a barrier material between the fill material and the dielectric material, the barrier material comprising a second metal, nitrogen, and at least one of S or Se.

2. The IC interconnect structure of claim 1, wherein the first metal is Co, Mo, W, or Cu.

3. The IC interconnect structure of claim 2, wherein the second metal is Ta or W.

4. The IC interconnect structure of claim 1, wherein the barrier material comprises Ta.

5. The IC interconnect structure of claim 1, further comprising a metal chalcogenide layer between the fill material and the dielectric material, wherein the metal chalcogenide layer comprises the second metal and the S or Se.

6. The IC interconnect structure of claim 5, wherein the barrier material comprises predominantly Ta and N, and wherein the metal chalcogenide layer comprises predominantly Ta and at least one of S or Se.

7. The IC interconnect structure of claim 5, the metal chalcogenide layer is between the fill material and the barrier material.

8. The IC interconnect structure of claim 5, wherein the barrier material has a first thickness, the metal chalcogenide layer has a second thickness, and wherein a sum of the first and second thicknesses is no more than 2 nm.

9. The IC interconnect structure of claim 8, wherein the second thickness less than 1 nm and wherein the metal chalcogenide layer has greater crystallinity than the barrier material.

10. The IC interconnect structure of claim 1, wherein the IC interconnect structure comprises:
    a first line metallization under the dielectric material;
    a via metallization through the dielectric material, and coupled to the first line metallization; and
    a second line metallization over, and coupled to, the first line metallization through the via metallization, wherein the second line metallization comprises:
    the fill material and the barrier material, and wherein the first metal is Cu.

11. A computer platform comprising:
    a power supply; and
    an integrated circuit (IC) coupled to the power supply, wherein the IC comprises:
    a device layer comprising a plurality of transistors comprising one or more semiconductor materials; and a plurality of interconnect levels, the interconnect levels further comprising:
a first line metallization;
a dielectric material over the first line metallization;
a via metallization through the dielectric material, and coupled to the first line metallization; and
a second line metallization over, and coupled to, the first line metallization through the via metallization, wherein the second line metallization comprises a barrier material comprising a metal, nitrogen and one or more chalcogens.

12. The computer platform of claim 11, wherein the IC comprises a microprocessor.

13. The computer platform of claim 11, wherein a metal chalcogenide layer is in physical contact with the barrier material, the metal chalcogenide layer comprising the metal and the one or more chalcogens.

14. A method of fabricating an integrated circuit (IC) interconnect structure, the method comprising:
forming at least one of a via opening or a trench in a dielectric material;
depositing a barrier material on a surface of the dielectric material, the barrier material comprising a first metal and nitrogen;
depositing a fill material over the barrier material within the via opening or the trench, wherein the fill material comprises a second metal; and
doping the barrier material with at least one of S or Se.

15. The method of claim 14, further comprising forming a metal chalcogenide layer by reacting the first metal with the S or Se.

16. The method of claim 15, wherein depositing the barrier material comprises forming a metallic compound comprising predominantly Ta and N, and wherein reacting the first metal with the one or more chalcogens comprises reacting Ta with at least S.

17. The method of claim 16, wherein doping the barrier material comprises heating the IC interconnect structure to a temperature over 100° C. in the presence of at least $H_2S$.

18. The method of claim 17, wherein reacting the first metal with the one or more chalcogens further comprises heating the IC interconnect structure to a temperature over 200° C.

19. The method of claim 15, wherein depositing the barrier material comprises forming a barrier material layer having a first thickness, and wherein forming the metal chalcogenide layer comprises converting a portion of the first thickness into the metal chalcogenide layer.

* * * * *